United States Patent
Mandal

(10) Patent No.: US 6,559,070 B1
(45) Date of Patent: May 6, 2003

(54) MESOPOROUS SILICA FILMS WITH MOBILE ION GETTERING AND ACCELERATED PROCESSING

(75) Inventor: Robert P. Mandal, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/547,714

(22) Filed: Apr. 11, 2000

(51) Int. Cl.$^7$ ................................. H01L 21/31
(52) U.S. Cl. .................. 438/781; 438/781; 438/623; 427/162
(58) Field of Search ................. 438/638, 624, 438/790, 787, 781, 782, 794, 793, 778, 99, 780

(56) References Cited

U.S. PATENT DOCUMENTS

| | | | | |
|---|---|---|---|---|
| 4,944,895 A | * | 7/1990 | Buckley et al. | 427/162 |
| 5,047,369 A | * | 9/1991 | Fleming et al. | 437/240 |
| 5,858,457 A | * | 1/1999 | Brinker et al. | 427/162 |
| 5,958,577 A | * | 9/1999 | Sugimoto et al. | 428/333 |
| 6,048,804 A | * | 4/2000 | Smith et al. | 438/790 |
| 6,153,511 A | * | 11/2000 | Watatani | 438/623 |
| 6,218,302 B1 | * | 4/2001 | Braeckelmann et al. | 438/687 |
| 6,284,682 B1 | * | 9/2001 | Troczynski et al. | 201/12 |

OTHER PUBLICATIONS

Narayan K. Raman, et al., Editors, *Template–Based Approaches to the Preparation of Amorphous Nanaporous Silicas, Chem. Mater.* vol. 8, American Chemical Society, pp. 1682–1701, Albuquerque, New Mexico 1996.

* cited by examiner

*Primary Examiner*—Olik Chaudhuri
*Assistant Examiner*—Julio J. Maldonado
(74) *Attorney, Agent, or Firm*—Moser Patterson & Sheridan

(57) ABSTRACT

The present invention generally provides a process and an apparatus for depositing low dielectric constant films on a substrate. The low dielectric constant films are phosphorus doped mesoporous oxide films formed by depositing and curing a phosphorus containing sol-gel precursor to form an oxide film having interconnecting pores of uniform diameter, and then annealing the film in an inert gas atmosphere or exposing the film to an oxidizing atmosphere containing a reactive oxygen species to form a phosphorus doped mesoporous oxide film.

40 Claims, 18 Drawing Sheets

"CUBIC" PHASE      MESOPOROUS OXIDE

MESOPOROUS SILICA FILMS WITH MOBILE ION GETTERING AND ACCELERATED PROCESSING

BACKGROUND OF THE INVENTION

1. Field of the Invention

The present invention relates to the fabrication of integrated circuits. More particularly, the invention relates to a process for depositing dielectric layers on a substrate.

2. Background of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 μm and even 0.18 μm feature sizes, and tomorrow's plants soon will be producing devices having even smaller geometries.

In order to further reduce the size of devices on integrated circuits, it has become necessary to use conductive materials having low resistivity and insulators having low dielectric constants (k, wherein k<4.0) to reduce the capacitive coupling between adjacent metal lines. Low k dielectrics have been deposited by both spin-on glass methods and by chemical vapor deposition (CVD) techniques as described in International Publication Number WO 99/41423. Liner/barrier layers including capping layers have been deposited adjacent to the low k dielectric layers to prevent diffusion of byproducts such as moisture from the low k dielectric layer onto the conductive material as described in International Publication Number WO 99/41423, and from the ambient environment into the low k dielectric.

For example, moisture generated during the formation of a low k insulator readily diffuses to the surface of the conductive metal and increases the resistivity of adjacent conductive metal surface. To prevent interlayer diffusion, barrier/liner layers are deposited between the layers and are typically formed from conventional silicon based materials, such as silicon nitride, that block the diffusion of byproducts and/or prevent the diffusion of metal layers into the low k material. However, the barrier/liner layers typically have dielectric constants that are significantly greater than 4.0, such as silicon nitride with a dielectric constant of about 7, and the high dielectric constants can result in a combined insulator layer that does not significantly reduce the dielectric constant.

One approach to forming low k layers is to deposit a high porosity, low density film to obtain dielectric constants that approach the dielectric constant of air, i.e., k~1. An example of a low k porous film deposition process is described in U.S. Pat. No. 5,858,457, issued to Brinker et al. Brinker et al. discloses a method for forming a low dielectric constant films having high film porosity by the deposition of a sol-gel precursor on a substrate, followed by selective evaporation of components of the sol-gel precursor to form supramolecular assemblies. The assemblies are then formed into ordered porous films by the oxidative pyrolysis of the supra-molecular templates at approximately 400° C. However, in the Brinker at al. patent, the pyrolysis step requires about four hours to calcinate the sol-gel into a porous film. Such lengths of time are incompatible with the increasing demand for higher processing speeds in modem semi-conductor manufacturing.

High porosity silica-based films, such as the silicon oxide films described in Brinker et al. above, have poor diffusion resistance to charged mobile ions, especially alkali ions such as sodium and potassium formed in sol-gel precursors. These charge ions readily diffuse into and through the film under the influence of applied electric fields and increase the film's conductivity and result in polarization of the film as well as an increase the dielectric constant of the film. Therefore, the transport of charged mobile ions is deleterious to the low dielectric constant insulator films used for integrated circuit multi-level interconnections.

Additionally, silica-based porous films are often hydrophilic and aggressively absorb moisture from the surrounding environment. If water, which has a dielectric constant (k) of about 78, is absorbed by the porous film, then the low k dielectric properties of the porous film can be detrimentally affected. Often, these hydrophilic films are annealed to remove moisture, but this is only a temporary solution in a deposition process since the films are still sensitive to moisture contamination following this procedure. Additionally, annealing is often a time consuming process which adds to the processing time of the substrate and results in lower through put rates. Generally, to limit moisture contamination in hydrophilic films, the film is turned from a hydrophilic film to a hydrophobic film by a silylation process AND by depositing a capping or passivation layer to prevent moisture contamination in the porous film.

One problem in depositing capping layers on porous films is that porous films, such as spin-coating and spray-coating porous films are deposited at atmosphere pressure, i.e., greater than about 300 Torr, and the capping layer is typically deposited by a plasma enhanced chemical vapor deposition (PECVD) process carried out at vacuum pressures, i.e., less than about 100 Torr. Such vacuum processes and atmosphere processes are typically carried out in separate vacuum and atmosphere processing systems or cluster tool apparatuses, wherein transfer from one processing system or apparatus to another exposes the porous films to contamination. Cluster tools are modular, multi-chamber, integrated processing system having a central substrate handling module and a number of peripheral process chambers, where introduced substrates undergo a series of process steps sequentially in various process chambers to form integrated circuits. Cluster tools have become generally accepted as effective and efficient equipment for manufacturing advanced microelectronic devices.

FIG. 1 illustrates a vacuum cluster tool 10 having multiple single substrate processing chambers 12 mounted on a centralized vacuum chamber, called a transfer chamber 18, for transferring substrates from a substrate cassette located in one or more load lock chambers 20, to one or more process chambers 12. This particular tool is shown to accommodate up to four (4) single substrate processing chambers 12 positioned radially about the transfer chamber. A cluster tool similar to that shown in FIG. 1 is available from Applied Materials, Inc. of Santa Clara, Calif. The transfer of the substrates between the process chambers 12 is typically managed by a substrate handling module 16 located in a central transfer chamber 12. After the substrates are processed, they are moved back through the load lock chamber 20 and into substrate cassettes where the substrates can be moved to the next system for additional processing. Various processes, such as physical vapor deposition (PVD), chemical vapor deposition (CVD), etch, can be performed in the process chambers 12.

Typically, atmosphere processing cluster tools and vacuum processing cluster tools have not been integrated. Vacuum processing tools require the retention of a vacuum or reestablishment of a vacuum by vacuum pumping during various process steps in a process cycle. This vacuum requirement lends to longer processing times and a lower through-put rate than compared to atmosphere processing tools which has made integration of these systems unattractive. However, transfer of substrates between the cluster tools can result in contamination of the process substrates which is very problematic in the transfer of films sensitive to contamination, such as porous films. Currently in the industry, there are no cluster tools that combine the deposition of low k dielectric materials and capping materials under both ambient atmosphere and near vacuum processing conditions.

Therefore, there remains a need for a process to deposit ion diffusion resistant low k dielectric materials with high substrate throughput.

SUMMARY OF THE INVENTION

The present invention provides a method and apparatus for depositing a mesoporous silicon oxide layer having a low dielectric constant. In accordance with one aspect of the invention, the invention provides for a process for depositing a mesoporous oxide layer containing phosphorus and having a low dielectric constant. The mesoporous film preferably has a phosphorus concentration of a phosphorus compound, such as phosphorus pentaoxide ($P_2O_5$) of between about 2% and about 8% by weight. The mesoporous silicon oxide layer is produced by depositing and curing a phosphorus containing sol-gel precursor to form a oxide film having interconnecting pores of uniform diameter, preferably in a cubic phase structure, then exposing the film to an inert gas anneal at a temperature of between about 200° C. and about 450° C., or an oxidizing atmosphere containing a reactive oxygen species at a temperature between about 200° C. and about 400° C., to remove the surfactant and form a phosphorus doped mesoporous oxide film. The mesoporous oxide film preferably has a porosity of at least 50% and a dielectric constant between about 1.6 and about 2.2. The mesoporous film may also be used as a inter-metal dielectric layer.

The phosphorus containing sol-gel precursor preferably comprises a silicon/oxygen compound, a phosphorus containing acid solution, an organic solvent, water, and a surfactant. Phosphorus may also be introduced into the sol-gel precursor by the addition or substitution of a phosphonic acid ligand, (—$PO(OH)_2$), on a silicon bearing chemical precursor, by a phosphorus based acid solution comprising a phosphorus based acid, which may further include volatile inorganic acids and/or organic acids, and by a phosphorus based component of a surfactant, preferably a phosphate of an alcohol-terminated surfactant selected from the group comprising p-$(CH_3)_3CCH_2C_6H_4CH_2(OCH_2CH_2)_N$—OH, p-$(CH_3)_3COC_6H_4CH_2(OCH_2CH_2)_N$—OH, $(CH_3)_3CCH_2C(CH_3)_2C_6H_4(OCH_2CH_2)_N$—OH, $CH_3(CH_2)_K$—OH, $CH_3(CH_2)_I(CH_2CH_2O)_J$—OH, $HO(CH_2CH_2O)_M(CH_2C(CH3)HO)_L(CH_2CH_2O)_M$H, and fluorinated derivatives thereof, and combinations thereof, where N is an integer from 6 to 12, preferably 8, K is an integer from 13 to 17, I is an integer from 6 to 15, J is an integer from 20 to 106, and L is an integer from 20 to 80.

In another aspect of the invention a mesoporous oxide film may be formed on a substrate by forming a first sol-gel precursor comprising a first silicon/oxygen compound, an organic acid, a first organic solvent, water, and a first surfactant, forming a second sol-gel precursor comprising a second silicon/oxygen compound, a phosphorus based acid, a second organic solvent, water, and a second surfactant, mixing the first and second sol-gel precursors to form a mixed sol-gel precursor, depositing the mixed sol-gel precursor on the substrate, curing the deposited mixed sol-gel precursor to form an oxide film, and exposing the oxide film to a surfactant removing process to form a mesoporous oxide film. Preferably the first and second sol-gels are mixed in a first sol-gel precursor to second sol-gel precursor ratio of between about 1:1 and about 10:1. Preferably, the mesoporous oxide film has a phosphorus concentration of a phosphorus compound, such as phosphorus pentaoxide ($P_2O_5$) of between about 2% and about 8% by weight.

In yet another aspect of the invention, a method is provided for forming a dual damascene structure comprising depositing a first etch stop on a substrate, depositing a first phosphorus doped mesoporous oxide film on the first etch stop, depositing a second etch stop on the first phosphorus doped mesoporous oxide film, depositing a second phosphorus doped mesoporous oxide film on the second etch stop, depositing a third etch stop on the second phosphorus doped mesoporous oxide film, etching the third etch stop and second phosphorus doped mesoporous oxide film to define a vertical interconnect opening, and etching the second etch stop, the first phosphorus doped mesoporous oxide film, and the first etch stop through the vertical interconnect opening to further define the vertical interconnect, thereby exposing the substrate, and etching the third etch stop and the second phosphorus doped mesoporous oxide film to define a horizontal interconnect and form a dual damascene feature. Preferably, the mesoporous oxide film has a phosphorus concentration of a phosphorus compound, such as phosphorus pentaoxide ($P_2O_5$) of between about 2% and about 8% by weight.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
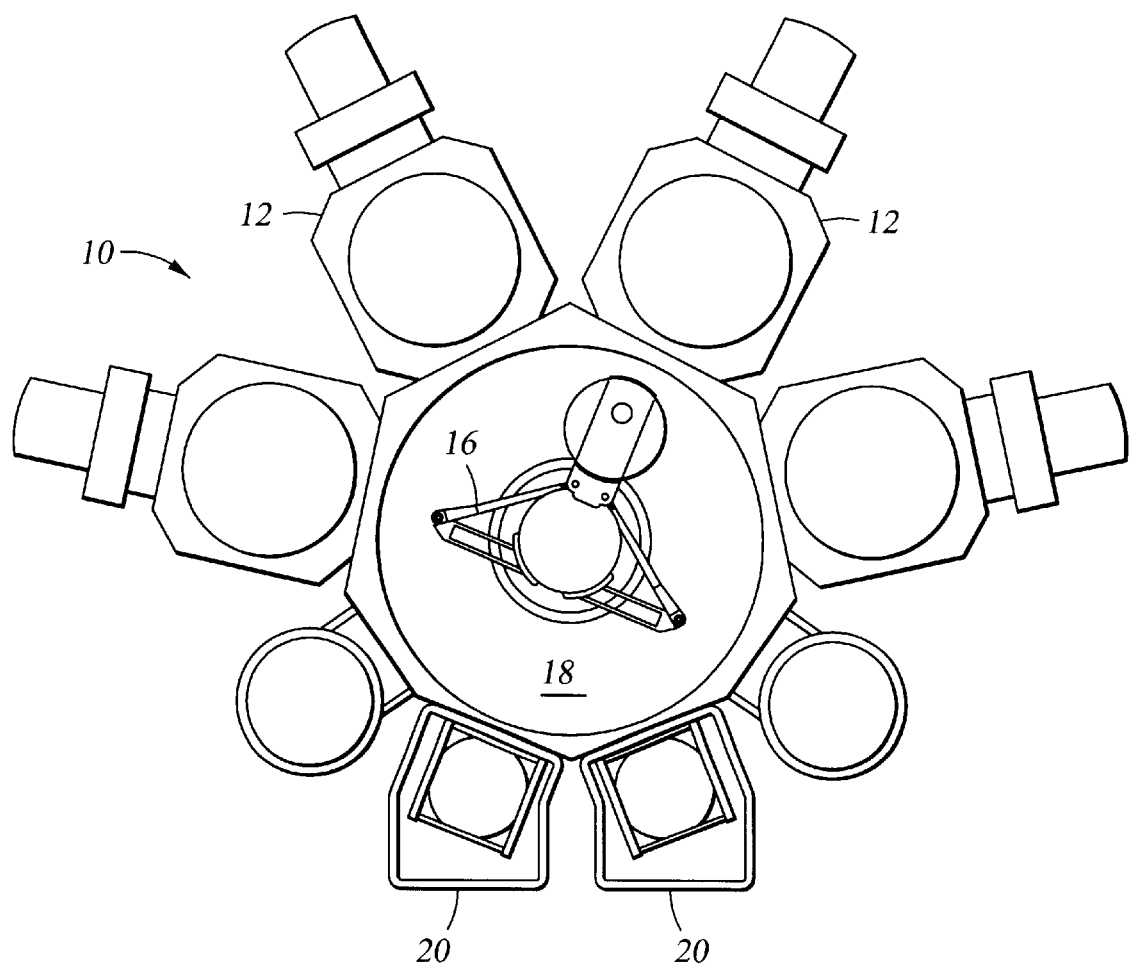
FIG. 1 is a top schematic view of a radial cluster tool for batch processing of semiconductor substrates.

The present invention provides a method and apparatus for depositing a mesoporous silicon oxide layer having a low dielectric constant. In accordance with one aspect of the invention, the invention provides for an process for depositing a mesoporous oxide layer having a low dielectric constant and a high phosphorus content. The mesoporous film preferably has a phosphorus concentration of a phosphorus compound, such as phosphorus pentaoxide ($P_2O_5$) of between about 2% and about 8% by weight, and most preferably at about 4%. The mesoporous oxide layer comprises silicon oxide and is produced by depositing and curing a phosphorus containing sol-gel precursor to form a oxide film having interconnecting pores of uniform diameter, preferably in a cubic phase structure, then exposing the firm to an oxidizing atmosphere containing a reactive oxygen species at a temperature between about 200° C. and about 400° C., to remove the surfactant and form a phosphorus doped mesoporous oxide film. Phosphorus introduced into the silicon oxide film will typically form phosphorus oxides, such as phosphorous pentaoxide. The mesoporous oxide film will have a porosity of al least 50% and a dielectric constant between about 1.6 and about 2.2. The mesoporous film may also be used as a inter-metal dielectric layer. It is believed that the phosphorus doping advantageously provides the combined benefits of ion mobilization, acceleration of deposited hydrolysis completion and condensation, and improved film strength.

The sol-gel precursor preferably comprises a silicon/oxygen compound, a phosphorus containing acid solution, an organic solvent, water, and a surfactant. The silicon/oxygen compound precursor is preferably tetraethylorthosilicate, methyltriethoxysilane, phenyltriethoxysilane, p-bis(triethoxysilyl)benzene, bis(triethoxysilyl)methane, hexaethoxydisiloxane, and combinations thereof. Additionally, the phosphorus may be introduced into the sol-gel precursor by the addition or substitution of a phosphonic acid ligand, (—PO(OH)$_2$), on a silicon bearing chemical precursor. Preferred phosphorus containing silicon/oxygen precursors include o-phosphotriethoxysilane (CH$_3$CH$_2$O)$_3$SiOPO(OH)$_2$, o-phosphoethyltriethoxysilane (CH$_3$CH$_2$O)$_3$SiCH$_2$CH$_2$OPO(OH)$_2$, phosphorylethyltriethoxysilane (CH$_3$CH$_2$O)$_3$SiCH$_2$CH$_2$PO(OH)$_2$, p-phosphorylphenyltriethoxysilane (CH$_3$CH$_2$O)$_3$Si(C$_6$H$_4$)PO(OH)$_2$, phosphonotriethoxysilyl ketone (CH$_3$CH$_2$O)$_3$SiC(O)PO(OH)$_2$, phosphonotriethoxysilane (CH$_3$CH$_2$O)$_3$SiPO(OH)$_2$, and combinations thereof.

Preferably, the phosphorus containing sol-gel precursor is formed with a phosphorus based acid solution. The acid solution acts as a catalyst to accelerate hydrolysis of the sol-gel precursor by lowering the hydrolysis activation energy, and catalyzing subsequent condensation reactions during film formation. The phosphorus containing acid solution is preferably a phosphorus based acid selected from the group of orthophosphoric acid (H$_3$PO$_4$), ammonium dihydrogen phosphate, tetramethylammonium dihydrogen phosphate, phosphate esters of long-chain alcohols, alkoxysilylphosphonates, substituted derivatives thereof, and combinations thereof. The phosphorus containing acid solution may also contain volatile inorganic acids, preferably nitric acid, hydrochloric acid, perchloric acid, and combinations thereof, and/or organic acids, preferably oxalic acid, glyoxylic acid, and combinations thereof Phosphorus may also be introduced into the sol-gel precursor by a phosphorus based component of a surfactant, preferably a phosphate of an alcohol-terminated surfactant selected from the group comprising p-(CH$_3$)$_3$CCH$_2$C$_6$H$_4$CH$_2$(OCH$_2$CH$_2$)$_N$—OH, p-(CH$_3$)$_3$COC$_6$H$_4$CH$_2$(OCH$_2$CH$_2$)$_N$—OH, CH$_3$(CH$_2$)$_K$—OH, CH$_3$(CH$_2$)$_I$(CH$_2$CH$_2$O)$_J$—OH, HO(CH$_2$CH$_2$O)$_M$(CH$_2$C(CH3)HO)$_L$(CH$_2$CH$_2$O)$_M$H, (CH$_3$)$_3$CCH$_2$C(CH$_3$)$_2$C$_6$H$_4$(OCH$_2$CH$_2$)$_N$—OH, and fluorinated derivatives thereof, and combinations thereof. N is an integer from 6 to 12, preferably 8, K is an integer from 13 to 17, I is an integer from 6 to 15, J is an integer from 20 to 106, and L is an integer from 20 to 80. Preferably, a non-phosphorus containing surfactant selected from the group of p-(CH$_3$)$_3$C—CH$_2$—C$_6$H$_4$—CH$_2$—(OCH$_2$CH$_2$)$_8$OH, p-(CH$_3$)$_3$COC$_6$H$_4$CH$_2$(OCH$_2$CH$_2$)$_8$—OH, and other polyethylene oxide co-polymer derivatives, polyethylene oxide-polypropylene oxide-polyethylene oxide triblock copolymer derivatives, and combinations thereof, is used to form the sol-gel precursor.

In another aspect of the invention a mesoporous oxide film may be formed on a substrate by forming a first sol-gel precursor comprising a first silicon/oxygen compound, an organic acid, an organic solvent, water, and a first surfactant, forming a second sol-gel precursor comprising a second silicon/oxygen compound, a phosphorus based acid, an organic solvent, water, and a second surfactant, mixing the first and second sol-gel precursors to form a mixed sol-gel precursor, depositing the mixed sol-gel precursor on the substrate, curing the deposited mixed sol-gel precursor to form an oxide film, and exposing the oxide film to a surfactant removing process to form a mesoporous oxide film. Preferably, the mesoporous oxide film has a phosphorus concentration of a phosphorus compound, such as phosphorus pentaoxide ($P_2O_5$) of between about 2% and about 8% by weight, and more preferably at about 4% by weight.

In yet another aspect of the invention, a method is provided for forming a dual damascene structure comprising depositing a first etch stop on a substrate, depositing a first phosphorus doped mesoporous oxide film on the first etch stop, depositing a second etch stop on the first phosphorus doped mesoporous oxide film, etching the first phosphorus doped mesoporous oxide film to define a vertical interconnect opening, depositing a second phosphorus doped mesoporous oxide film on the second etch stop, depositing a third etch stop on the second phosphorus doped mesoporous oxide film, depositing a hard mask film on the third etch stop, and etching the second phosphorus doped mesoporous oxide film through the vertical interconnect opening to further define the vertical interconnect, thereby exposing the substrate and etching the second phosphorus doped mesoporous oxide film to define a horizontal interconnect. Preferably, the mesoporous oxide film has a phosphorus concentration of a phosphorus compound, such as phosphorus pentaoxide ($P_2O_5$) of between about 2% and about 8% by weight, and more preferably at about 4% by weight.

Figure 2A:
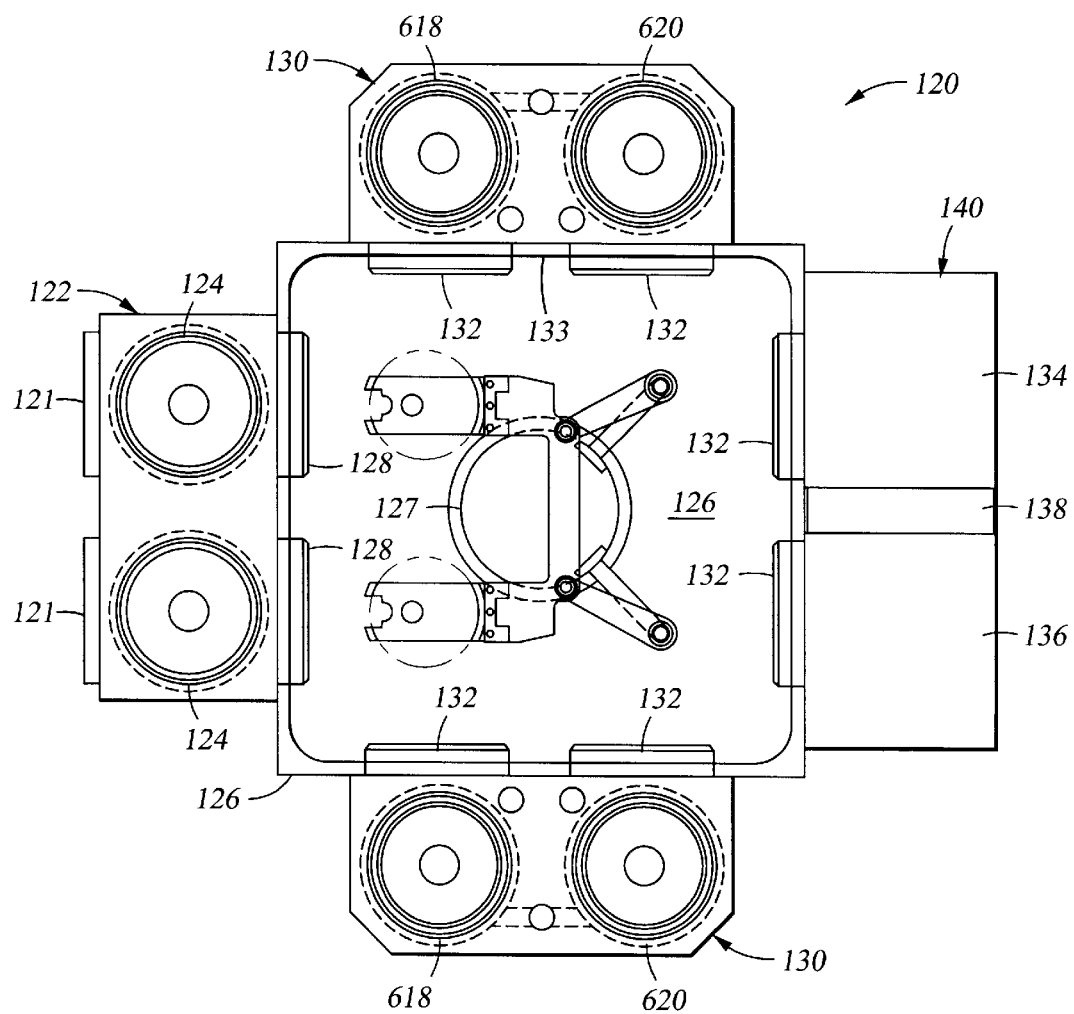
FIG. 2 is a top schematic view of one embodiment of an apparatus containing a capping module and high pressure deposition module of the present invention.
Figure 2B:
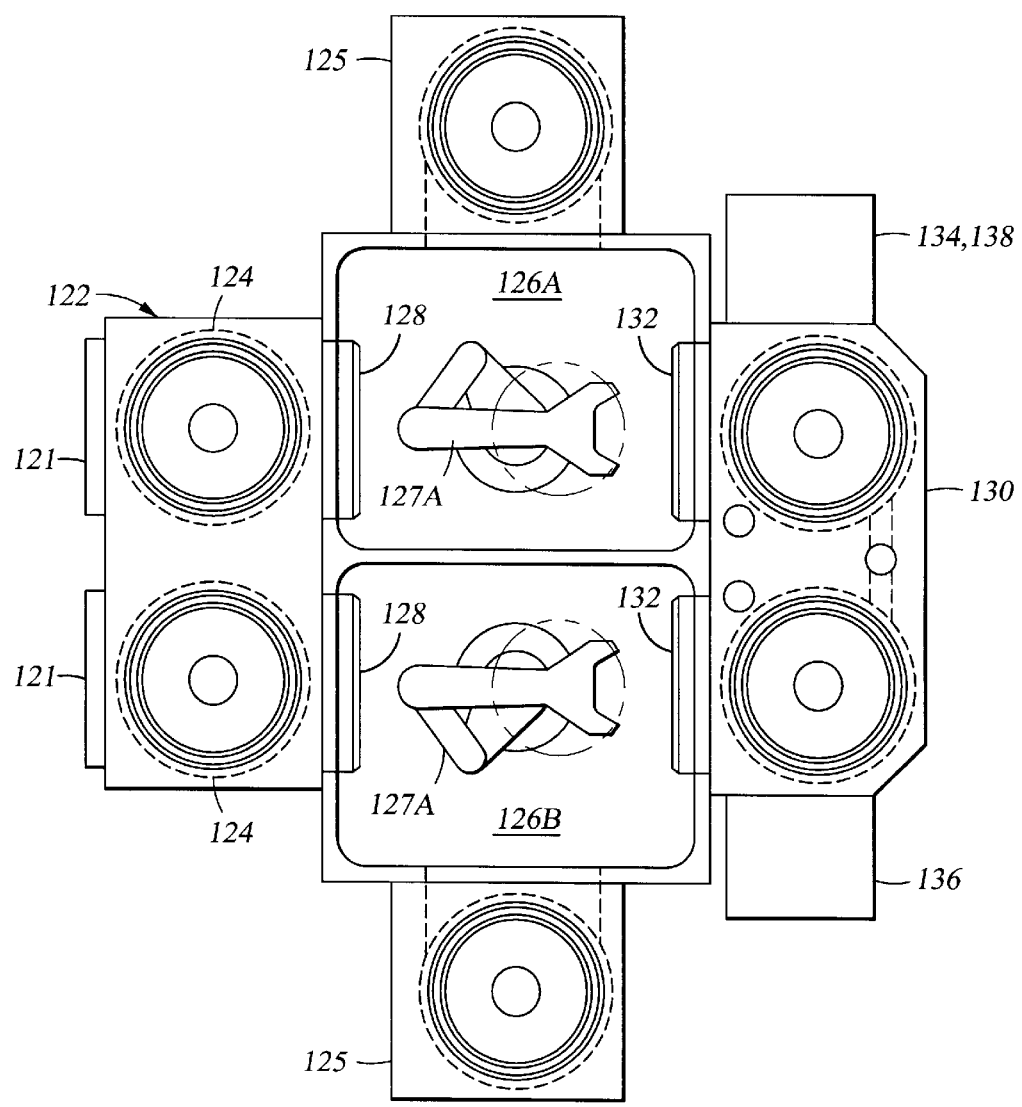
Figure 3A:
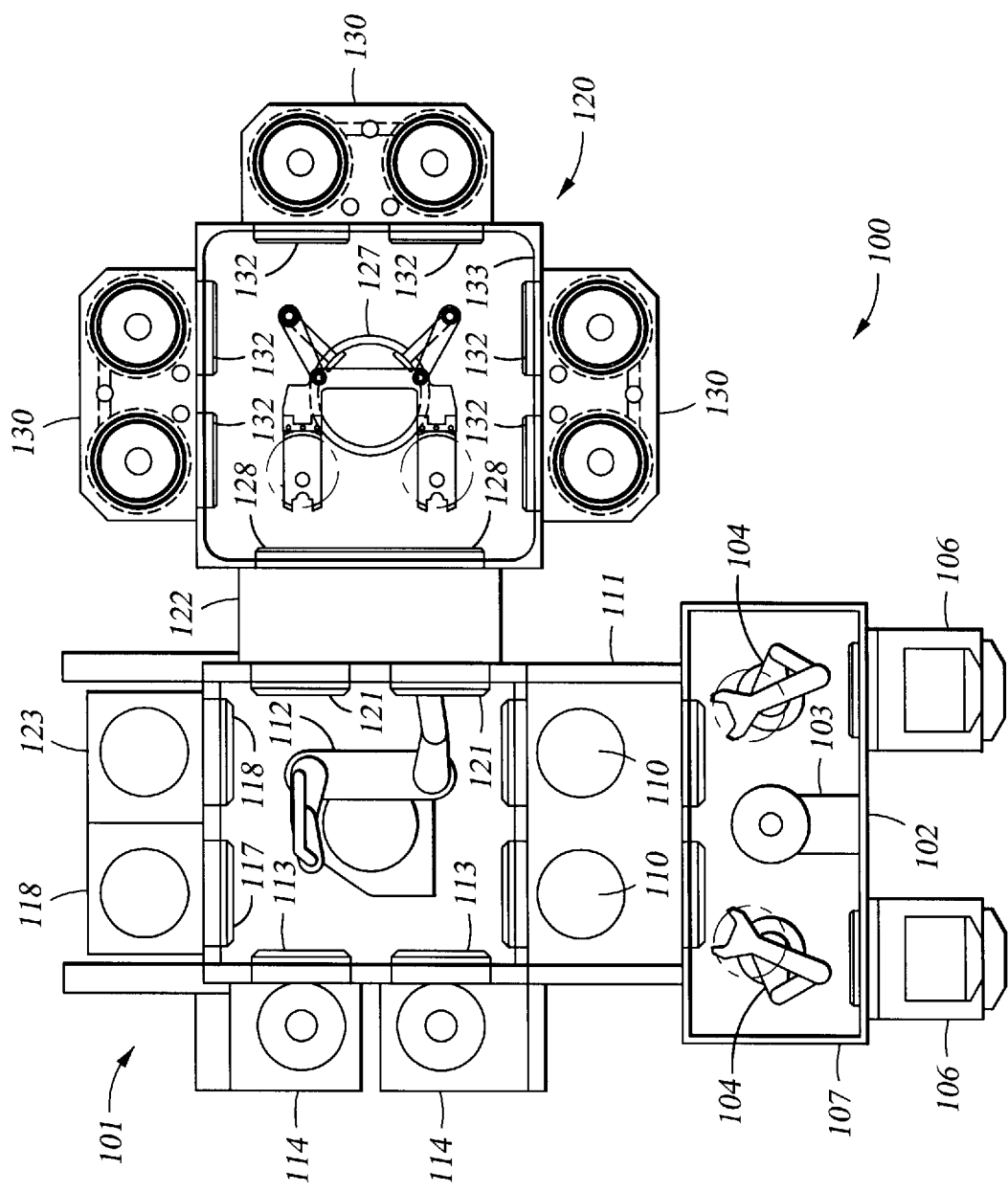
FIG. 3 is a top schematic view of one embodiment of a capping module of the present invention.
Figure 3B:
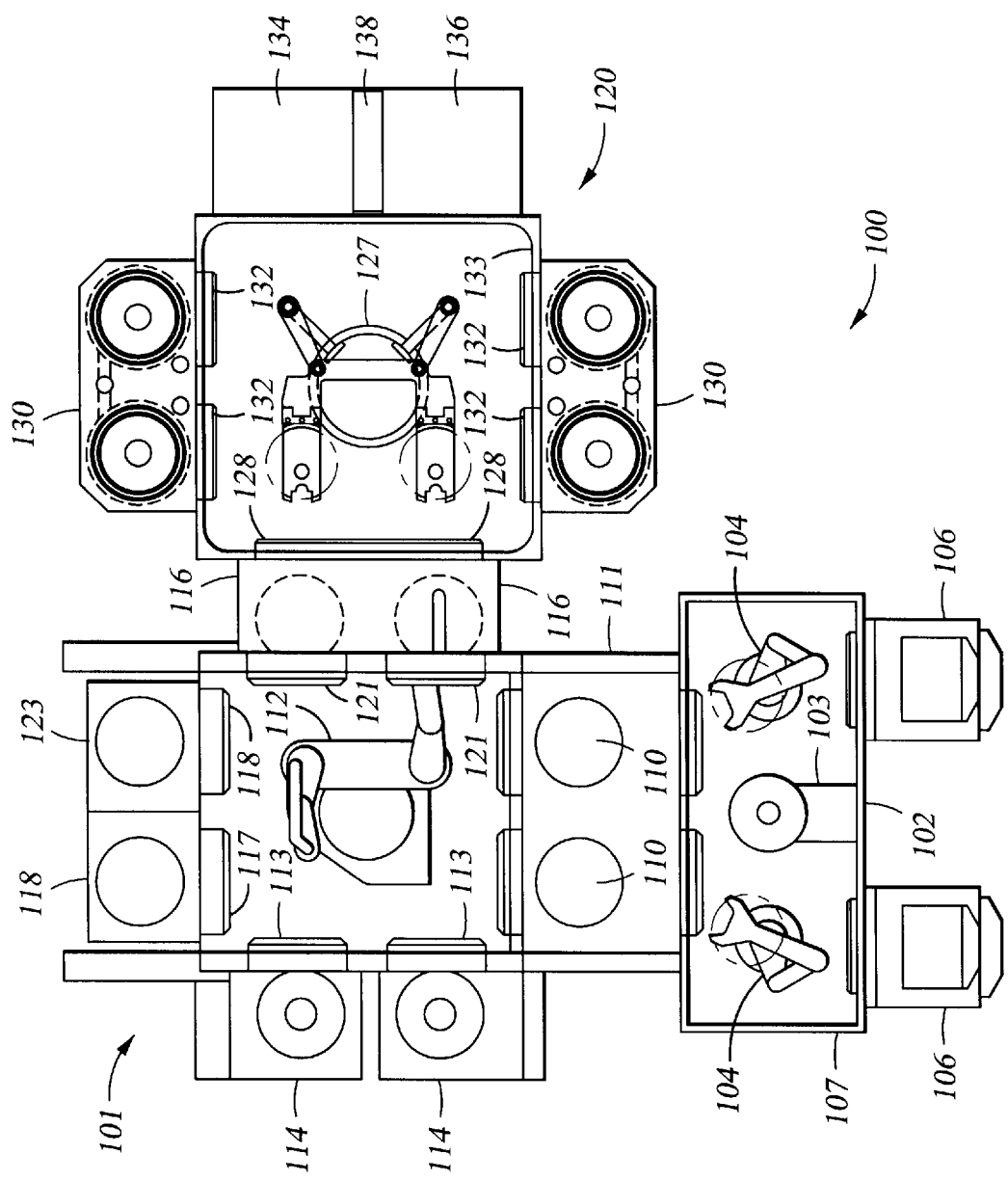

FIGS. 2A and 3A illustrate schematically one embodiment of a capping layer module 120 in which the above described processes of the invention may be performed. The capping module 120 is a near vacuum pressure processing module for deposition of films, particularly capping films deposited by plasma enhanced chemical vapor deposition (PECVD). Near vacuum pressures are defined herein as pressures of about 100 Torr and below, and preferably the pressure of the capping module are the similar to the operating pressure of the PECVD chamber of about 0.5 Torr to about 10 Torr. The module 120 is a self-contained system having the necessary processing utilities supported on a main frame structure 201 which can be easily installed and which provides a quick start up for operation. The module 120 generally includes four regions, namely, a factory interface 122, wherein substrates are introduced into the module 120, one or more transfer chambers 126 each housing a substrate handler 127, with the substrate handler 127 preferably in communication with a dual stack cooling/pre-heat loadlock chamber 124 disposed within the factory interface 122, one or more, but preferably two tandem or twin process chambers 130 mounted to the and in communication with the transfer chamber 126, and a back end 140 which houses the support utilities needed for operation of the module 120, such as a gas panel 134, power distribution panel 136, and the computer control rack 138 as shown in FIGS. 2B and 3B. The system can be adapted to accommodate various processes and supporting chamber hardware such as plasma enhanced chemical vapor deposition (PECVD). The embodiment described below will be directed to a system employing a PECVD process, such as a mesoporous oxide dielectric deposition process. However, it is to be understood that these other processes are contemplated by the present invention.

FIG. 2B illustrates another embodiment of a capping layer module 120 of the invention schematically. The capping module 120 also comprises four regions, namely, a factory interface 122, wherein substrates are introduced into the module 120, one or more transfer chambers 126A, 126B each housing a substrate handler 127A, 127B with the substrate handlers 127A, 127B preferably in communication with a dual stack cooling loadlock chamber 124 disposed within the factory interface 122 and in communication with a substrate preheating station 125, one or more, but preferably two tandem or twin process chambers 130 mounted to, and in communication with, the transfer chamber 126A, 126B, and a back end 140 which houses the support utilities needed for operation of the module 120, such as a gas panel 134, power distribution panel 136, and the computer control rack 138 as shown in FIGS. 2B and 3B. The substrate preheating station 125 generally comprises a plurality of vertically disposed substrate holders and provides heating to the substrates. The substrate holder alignment and substrate heating processes are disclosed in more detail below in the description for the pre-heating loadlock chamber 124, however, the invention contemplates other pre-heating stations.

Transfer Chamber

FIG. 2A shows a top schematic view of one embodiment of the processing module 120 of the present invention. The processing module 120 encompasses transfer chamber 126 inside a chamber sidewall 133. The transfer chambers include sidewalls 133 and bottom 135 and are preferably machined or otherwise fabricated from one piece of material, such as aluminum. A lid (not shown) for transfer chamber 126 is supported on the sidewalls 133 during operation to form a vacuum enclosure. The sidewall 133 of transfer chamber 126 supports processing chambers 130 and provides an attachment for a factory interface 122 which may contain one or more cooling/pre-heat loadlock chambers 124 (shown in FIG. 4 below) which may provide access via slit valve 121 to other transfer chambers or act as a substrate insertion point for processing in the processing chambers 130. The sidewall 133 for transfer chamber 126 defines passage 128 and 132 on each side through which access to the other chambers on the system is provided. The passages 128 and 132 disposed through the sidewalls 133 can be opened and closed using two individual slit valves or a tandem slit valve assembly. The passages 128 provide access the factory interface or substrate staging area 122 wherein substrates may be introduced into the transfer chambers 126. The passages 132 mate with the substrate passages 610 in process regions 618, 620 (shown in FIG. 9) to allow entry of substrates into the processing regions 618, 620 in processing chamber 130 for positioning on the substrate heater pedestal 628.

The processing chamber 130 and a substrate staging area 122 includes a slit valve opening and a slit valves 128, 132 which enable communication between the processing chamber 130, a substrate staging area 122, and the transfer chamber 126 while also providing vacuum isolation of the environments within each of these chambers to enable a staged vacuum within the system. Slit valves and methods of controlling slit valves are disclosed by Tepman et al. in U.S. Pat. No. 5,226,632 and by Lorimer in U.S. Pat. No. 5,363,872, both of which are incorporated herein by reference. The bottom 135 of the transfer chamber 126 defines a central passage (not shown) in which a substrate handler 127, such as a substrate handler assembly, extends and is mounted to the bottom 135 of the transfer chamber 126. A gas purge port (not shown) is disposed through the bottom 135 of the transfer chamber 126 to provide a purge gas during pump down.

FIG. 2B shows a top schematic view of another embodiment of the processing module 120 of the present invention. The second embodiment of the processing module 120 comprises two transfer chambers 126A, 126B inside a chamber sidewall 133. The transfer chambers 126A, 126B are isolated from one another and are in communication with both the factory interface 122 which preferably only contains one or more cooling chambers, and one or more pre-heat loadlock chambers 124 disposed perpendicular to the factory interface 112, and one or more processing chambers 130 or one or more processing regions 618, 620. The sidewall 133 for transfer chambers 126A, 126B defines passages 128 and 132 on each side through which access to the other chambers on the system is provided.

Substrate Handling In The Transfer Chamber of The Capping Module

Figure 4:
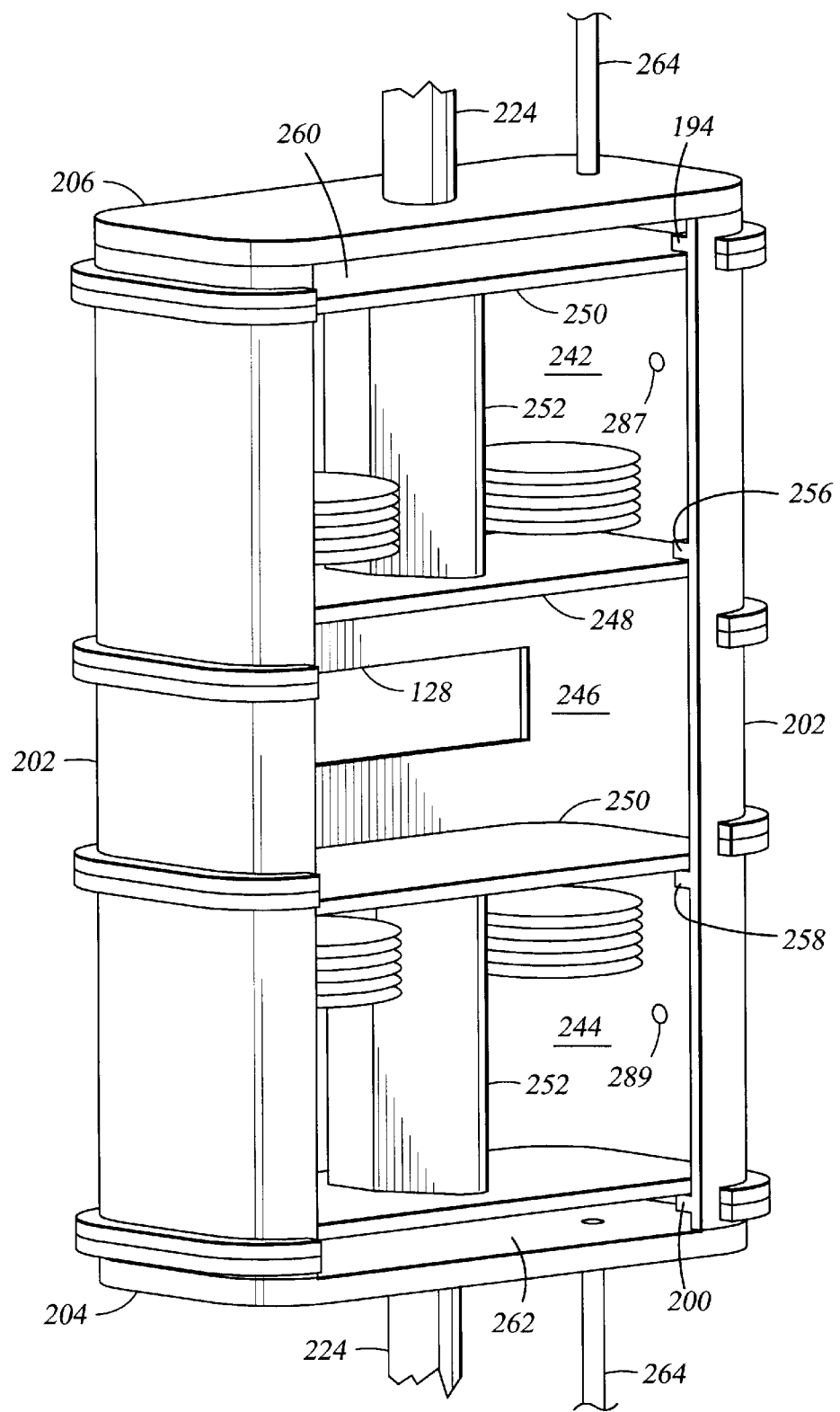
FIG. 4 is a perspective view of an embodiment of a loadlock chamber of the present invention.

Referring to FIG. 2A, the substrates provided to the capping layer module 120 by the front end staging area 122 are handled by the capping layer module 120 as follows. Once the front end staging area 122 is loaded, the transfer chamber front vacuum doors 128 to the staging area 122 close and the transfer chamber 126 is pumped down to vacuum processing conditions. The transfer chamber 126 is pumped down by the single or two on-board vacuum pumps (not shown) disposed on the capping module 120. After vacuum pumping to a sufficiently low pressure and following substrate preheating in the loadlock 124, preferably in a preheating compartment 244 (as shown in FIG. 4 below), the pneumatically actuated front vacuum doors 128 of the transfer chamber 126 open simultaneously allowing access between the transfer chambers 126 and the front end staging area 122. The substrate handling member 127 indexes the substrates held in the dual stack cooling/pre-heat loadlock chamber 124 located in the substrate staging area 122. Then, the substrate handling members within the transfer chamber 126, the dual bladed transfer chamber substrate handling member 127, simultaneously retrieve a substrate from each stack of the dual stack cooling/pre-heat loadlock chamber 124 located in the front end staging area 122 and simultaneously transfer the substrates into the processing regions 618, 620 of a twin processing chamber 130 or transfer the respective substrate into individual processing chambers 130 depending upon the capping module's 120 configuration. Alternatively, the substrates may be pre-positioned in front of the slit valves 132 to the processing chamber 130 during the vacuum pump.

Once the substrate is deposited, the transfer chamber substrate handlers 127 withdraw from the processing chamber 130 and the slit valves 132 are closed. The substrate having already been deposited with a dielectric layer in the high pressure deposition module 101 is then deposited with a capping layer by PECVD in the processing chamber 130. After processing is finished, the slit valves 132 are opened and the transfer chamber substrate handler 127 remove the substrates from the processing regions 618, 620 and deposit the substrates in the cooling compartment 242 of the dual stack cooling/pre-heat loadlock chamber 124. After depositing a substrate in the preheating modules 124, the substrate handler retrieves the next pair of substrates from dual stack cooling/pre-heat loadlock chamber 124 indicated in the indexing sequence. This substrate is then transferred, processed, and retrieved by the transfer chamber substrate handler 127 as the preceding substrate. This process continues until all of the substrates of the pre-heating compartment 244 are processed in the PECVD processing chamber 130 and deposited in the cooling compartment 244. After the last substrate is processed the slit valves 132 to the processing chamber 130 are closed.

The transfer chamber 126 is then vented to atmosphere pressure using an inert gas, such as argon, and the front vacuum doors 128 are opened. The transfer chamber venting may optionally begin as soon as the slit valves 132 have closed after the last pair of substrates have been processed. This allows the transfer chamber 126 to be vented as the last set of substrates are being returned to the dual stack cooling/pre-heat loadlock chamber 124 which reduces processing time in the capping module 120. Once venting is complete, the transfer chamber substrate handler 112 of the high pressure deposition module 101 retrieve the substrates from the dual stack cooling/pre-heat loadlock chamber 124 and simultaneously unload all of the processed substrates to the substrate cassettes 104 located in the front end staging area 102 of the high pressure deposition module 101.

After the last pair of substrates in each batch have been processed and removed from the processing chamber 130 and the slit valves 132 have been closed, the process chamber cleaning process can occur preparing the processing chamber for the next batch of substrates. This enables the cleaning process to be ongoing in the background while the transfer chamber 126 is being vented and the substrates are being exchanged.

High Pressure Deposition Module

Referring back to FIG. 3A, another embodiment of the invention the capping layer module 120 is coupled with a high pressure deposition module 101 via a substrate staging area 122. The high pressure deposition module 101 preferably deposits dielectric materials, such as mesoporous oxide films discussed below, and is often referred to as the high pressure deposition module. The high pressure deposition module 101 is a near atmosphere pressure processing module for deposition of films, where high pressure, or near atmospheric pressure, is defined herein as pressures of about 300 Torr and greater, and preferably at pressure of greater than 500 Torr.

The coupled capping layer module 120 and high pressure deposition module 101 form the processing system 100 of the present invention. The substrate staging area 122 uses the dual stack cooling/pre-heat loadlock chamber 124 to transfer substrates between the capping layer module 120 and the high pressure deposition module 101. The high pressure deposition module 101 is preferably a staged atmosphere system which includes one or more substrate spinner chambers 114 with respective slit valves 113, one or more substrate curing chambers 116 with respective slit valves 115, one or more substrate stripping chambers 118 with respective slit valves 117, one or more silylation deposition chambers 123 with respective slit valves 119, dual stack cooling stations 110 in cooling station 111, and a substrate handling member 112 disposed in the transfer chamber 108 of the high pressure deposition module 101. Preferably, there are at least one of each spinner 114, curing 116, stripping 118, and silylation 123 chambers, wherein each type of chamber is mounted in a vertically spaced stack within the transfer chamber 108 of the high pressure deposition module 101.

As shown in FIG. 3B, the chambers, such as the one or more substrate curing chambers 116 may be mounted on or in loadlock 124 for efficient conservation of space. The substrate handling member 112 is generally a two armed substrate handler 112, preferably having two arms with independent rotational movement, with each arm capable of accessing the various chambers within the transfer chamber 108 of the module 101. Alternatively, the two armed substrate handler 112 may have tandem moving arms and preferably of the same model as the substrate handler 127 of the capping layer module 120.

The front end staging area 102 of the high pressure deposition module 101 of the processing system 100 typically has one or more substrate cassettes 106 mounted in a horizontally spaced relationship from one another on a staging platform 102 which is coupled to the transfer chamber 108 of the high pressure deposition module 101. The substrate cassettes 106 are adapted to support a plurality of substrates mounted in a spaced vertical arrangement. The substrate cassettes 106 preferably includes two or more cassette plates (not shown) or other substrate supports disposed in a spaced vertical relationship to support the substrates disposed therein in a stacked vertical arrangement. A substrate rest 103 may be disposed between the dual stack cooling stations 110 in cooling station 111 and the loadlocks 106 to provide a cooling rest for substrates during substrate exchange between the cooling station 111 and the loadlocks 106. Alternatively, the substrate rest 103 may provide a preheating station for substrates passing into the module 101 for processing.

A pair of substrate handlers, or staging substrate handlers 104, are disposed in the front end staging area 102. The staging substrate handlers 104 are adapted to load a substrate into and remove a substrate from the high pressure deposition module 101 or the substrate cassettes 106 of the high pressure deposition module 101, wherein the staging substrate handler 104 is preferably positioned between the substrate cassettes 106 and the dual stack cooling stations 110 of the high pressure deposition module 101. Preferably, the staging substrate handler 104 includes a substrate indexing system to index the substrates in each substrate cassette 106 in preparation for loading the substrates into high pressure deposition module 101. One substrate handler with a substrate mapping system used advantageously in the present system is available from Equippe Technologies, located in Sunnyvale, Calif., as Model Nos. ATM 105 or 107. The substrate mapping sensor verifies the number of substrates and orientation of the substrates in the cassette 106 before transferring the substrates into the transfer chamber 108 of the high pressure deposition module 101 for dielectric layer deposition.

The high pressure deposition module 101 shown in FIG. 3A contains two vertically stacked dual substrate spinner chambers 114, two columns of four vertically stacked substrate curing chambers 116, four twin vertically stacked substrate stripping chambers 118 and silylation deposition chambers 123. All of the vertically stacked chambers face a substrate handler 112 disposed centrally to chambers 114, 116, 118, 123.

Substrate Handling In The High Pressure Deposition Module

The dielectric substrate handling process begins with the staging substrate handlers 104 indexing the substrates in each substrate cassette 106. Once indexed, the substrates are transferred by the staging substrate handlers 104 to the dual stack cooling stations 110 in cooling station 111. The high pressure deposition module substrate handler 112 retrieves a substrate from the dual stack cooling stations 110 and transfers the substrate to the dielectric substrate spinner chamber 114 for deposition of a sol-gel precursor layer. The module substrate handler 112 may fill up the substrate spinner chamber 114 before processing occurs or may be programmed for multiple spinner chambers to deposit substrates in the substrate spinner modules 114 while one or more spinner modules 114 are processing a substrate. Once the sol-gel precursor has been deposited, the module substrate handler 112 retrieves the substrate and transfers the substrate to a curing or baking chamber 116. Due to the relative length of curing compared to other process step in the dielectric layer deposition sequence, a proportionately larger number of curing chambers 116, preferably about 8 curing chambers per two dual substrate spinner chamber 114, are located within the transfer chamber 108 of the module 101. The module substrate handler 112 may be programmed to fill up the curing chambers 116 with spin-on deposited substrates prior to processing or may be programmed to load and unload substrates in the curing chambers 116 as desired. After, the desired amount of curing has been achieved, the substrate is transferred to a substrate stripping chamber 118. The substrate is placed within the ozone stripper for removal of surfactant remaining in the cured sol-gel precursor. While, not shown, an optional anneal chamber may be disposed in the transfer chamber 108 of the module 101 for annealing the substrate to remove moisture, solvents, or surfactants from the substrate to either prepare the substrate for the ozone strip or provide an alternative method of forming the mesoporous film besides by ozone stripping.

If the deposited dielectric film is to be silylated, the substrate is then retrieved from the substrate stripping chamber 118 and transferred to the silylation chamber 123. Alternatively, for a capping layer to be deposited, the substrate is transferred to the substrate staging area 122 for the capping layer module 120. Once processed by either the silylation chamber 123 or the capping module 120, the substrate handler 112 retrieves the substrate and transfers the substrate to the substrate cassettes 106 via the dual stack cooling stations 110.

Front End Staging Area

Referring back to FIGS. 2 and 3, the factory interface or substrate staging area 122 is an atmosphere pressure apparatus which allows quick transfer from the substrate staging area to chambers, such as the high pressure deposition module 101 prior to vacuum pumping, that typically operate at or near atmosphere pressures. FIG. 3A shows the front end staging area 102 of the module 101 which preferably includes a dual stack cooling/pre-heat loadlock chamber 124 having one or more substrate cassettes mounted within the dual stack cooling/pre-heat loadlock chamber 124 for processing. The substrate cassettes are designed to support a plurality of substrates in a spaced vertical relation, wherein substrate handling members 112, 127 may deposit and retrieve the substrates from opposites side of the substrate cassettes. In the alternative embodiment shown in FIG. 2A, the loadlock chamber 124 also functions as a cooling station for substrate transport between modules 101 and 120, and the pre-heating performed in a separate chamber.

Substrates housed in the cooling/pre-heat loadlock chamber 124 prior to or after processing are loaded into the module 120 through one or more transfer chamber doors 128 (shown in FIG. 2A) disposed through transfer chamber sidewall 133. A substrate handler 127 in the transfer chamber 126 is located adjacent to cooling/pre-heat loadlock chamber 124 and the transfer chamber doors 128. Preferably, the substrate handler 127 includes a substrate mapping system to index the substrates in each substrate cassette in preparation for loading and unloading the substrates into the processing chambers 130 mounted to the transfer chamber 126.

The substrate handler 127 can enter the load lock chamber 124 at the same time as another substrate handler 112 (shown in FIG. 3A) since the load lock is at atmosphere for transferring the substrates to the load lock chamber 124 from the high pressure deposition module 101. The opening in the side 128 of the transfer chamber 126 will have been closed prior to vacuum pumping of the transfer chamber 126 which is done prior to transferring the substrates into the processing chamber 130 for deposition of a capping layer.

Dual Position Loadlock Chamber

FIG. 4 shows a cut-away perspective view of a cooling/pre-heat loadlock chamber 124 of the present invention. The cooling/pre-heat loadloack chamber 124 includes chamber walls 202, a bottom 204, and a lid 206. The chamber 124 includes two separate environments or compartments 242, 244 and a transfer region 246. Compartments 242, 244 include a substrate cassette in each compartment 242, 244 to support the substrates therein. Each compartment 242, 244 includes a support platform 248 and a top platform 250 to define the bottom and top of the compartments 242, 244. A support wall 252 may be disposed vertically within the compartments 242, 244 to support platforms 248, 250 in a spaced relationship. Transfer region 246 includes one or more passages 121 for providing access from the cooling/pre-heat loadloack chamber 124 into the transfer chambers 108, 126. Passages 121 are preferably opened and closed using slit valves and slit valve actuators.

Compartment 242 provides a cooling station for substrates following processing in the processing chambers of transfer chamber 108 or in the capping module 120. In the alternative embodiment shown in FIG. 2A, both compartments 242, 244 may provide cooling stations for substrates following processing in the processing chambers of transfer chamber 108 or in the capping module 120.

Compartment 244 is selectively heated with respect to compartment 242, thereby acting as a pre-heat module prior to processing of the substrates in the processing chambers 130 of the capping module 120. The heating compartment 244 preferably has a heating element, such as a heating lamp, fluid heat exchanger, or a resistive heating element, to heat substrates individually therein, or alternatively, may have a heating element for heating all substrates within the compartment 244 concurrently. In another embodiment of the loadlock 124, the curing modules 116 may be mounted in the pre-heating compartment 244, thereby providing curing of the deposited film or pre-heating of the substrate prior to processing in module 120 while efficiently conserving space.

Compartments 242, 244 are each connected to an elevator shaft 224, each of which is connected to a motor, such as a stepper motor or the like, to move the compartments upwardly or downwardly within the cooling/pre-heat loadloack chamber 124. A sealing flange 256 is disposed peripherally within the cooling/pre-heat loadloack chamber 124 to provide a sealing surface for support platform 248 of compartment 242. Sealing flange 258 is similarly disposed to provide a sealing surface for support platform 250 of compartment 244. The compartments 242, 244 are isolated from one another by sealing flanges 256, 258 to provide independent staged vacuum of the compartments 242, 244 within the cooling/pre-heat loadloack chamber 124.

A back side pressure is maintained in spaces 260, 262 through a vacuum port disposed therein. A vacuum pump is connected to the spaces 260, 262 via exhaust lines 264 so that a high vacuum can be provided in the spaces 260, 262 to assist in sealing the platforms 248, 250 against the sealing flanges 256, 258.

In operation, compartments 242, 244 can be loaded or unloaded in the position shown in FIG. 4. Loading doors and actuators (not shown), are provided through the front wall (not shown) at the upper and lower limits of the cooling/pre-heat loadloack chamber 124 corresponding with compartments 242, 244. The pressure in a selected compartment is pumped down after substrates have been loaded into the compartment via exhaust lines 287, 289 and the selected compartment is moved into the transfer region 246. Compartments 242, 244 move independently into the transfer region 246 by the stepper motor. The advantage of having upper and lower compartments 242, 244 is that processing of one set of substrates can occur while a second set of substrates is loaded into the other compartment and that compartment is pumped down to the appropriate pressure so that the compartment can be moved into the transfer region 246 and in communication with the transfer chambers 108, 126.

Transfer Chamber Substrate Handler

Figure 5:
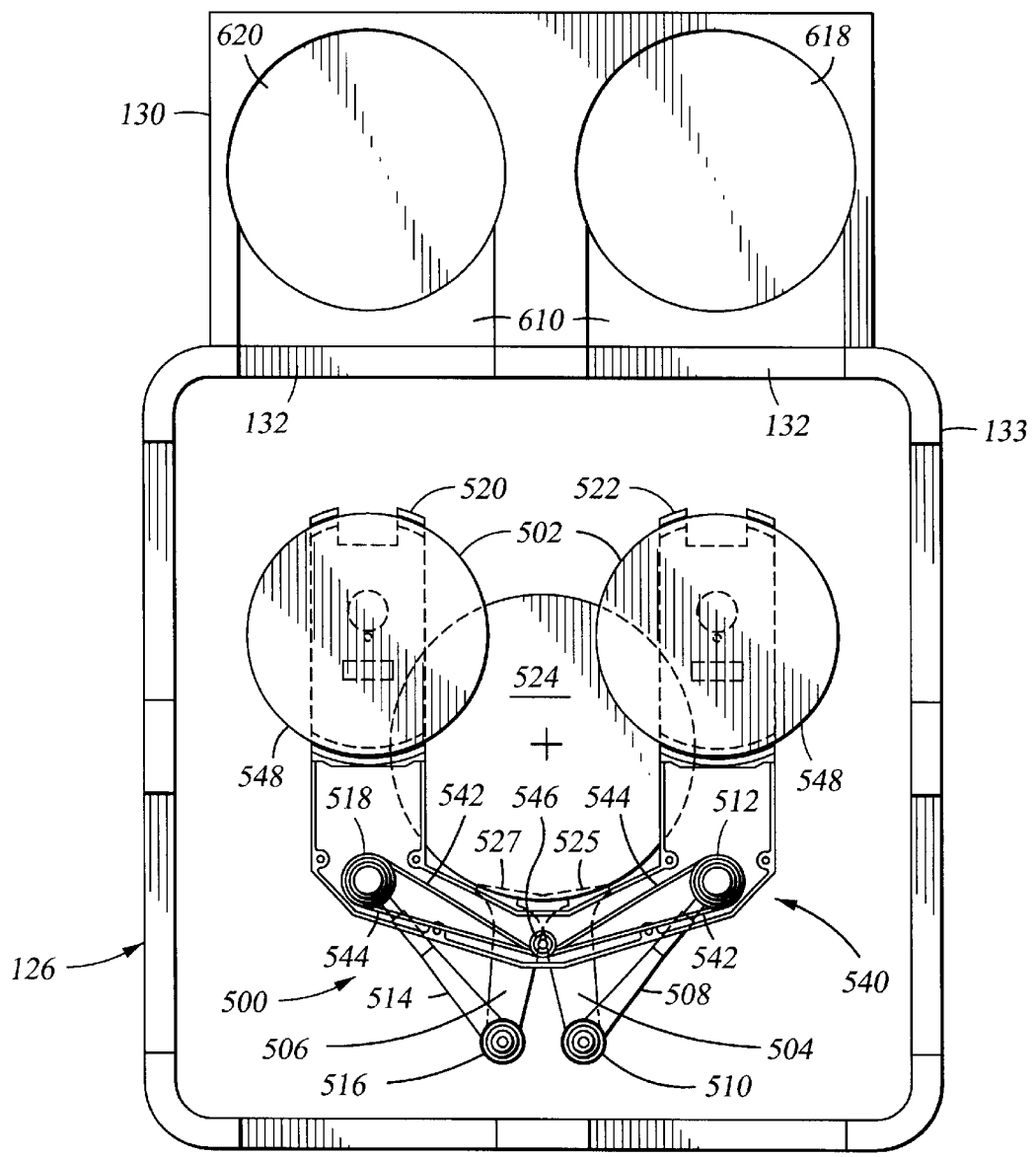
FIG. 5 is a top view of a transfer chamber and a processing chamber showing a substrate handling member of the present invention mounted in the transfer chamber and in a retracted position ready for rotation within the transfer chamber or extension into another chamber.

FIG. 5 shows a top schematic view of one embodiment of a magnetically coupled substrate handler 500 of the present invention in a retracted position for rotating freely within the transfer chamber 126 (and alternatively in the transfer chamber 108, described in detail above). A substrate handler having dual substrate handling blades 520, 522 is located within the transfer chamber 126 to transfer the substrates 502 from one chamber to another. A "very high productivity" (VHP) type substrate handler which can be modified and used to advantage in the present invention is the subject of U.S. Pat. No. 5,469,035 issued on Nov. 21, 1995, entitled "Two-axis Magnetically Coupled Substrate handler", and is incorporated herein by reference.

The magnetically coupled substrate handler 500 comprises a frog-leg type assembly connected between two vacuum side hubs (also referred to as magnetic clamps) and dual substrate blades 520, 522 to provide both radial and rotational movement of the substrate handler blades within a fixed plane. Radial and rotational movements can be coordinated or combined in order to pickup, transfer, and deliver two substrates from one location within the system 100 to another, such as from one processing chamber 130, to another chamber, such as the loadlock 124. In the embodiment shown in FIG. 2B, a single armed robot is disposed in transfer chambers 126A, 126B.

The substrate handler includes a first strut 504 rigidly attached to a first magnet clamp 524 at point 525 and a second strut 506 rigidly attached to a second magnet clamp 526 (disposed concentrically below the first magnet clamp 524) at point 527. A third strut 508 is attached by a pivot 510 to strut 504 and by a pivot 512 to the substrate blade assembly 540. A fourth strut 514 is attached by a pivot 516 to strut 506 and by a pivot 518 to the substrate blade assembly 540. The structure of struts 504, 508, 506, 514 and pivots 510, 512, 516, 518 form a "frog leg" type connection between the substrate blade assembly 540 and the magnet clamps 524, 526.

When magnet clamps 524, 526 rotate in the same direction with the same angular velocity, then substrate handler 500 also rotates about axis A in this same direction with the same velocity. When magnet clamps 524, 526 rotate in opposite directions with the same absolute angular velocity, then there is no rotation of assembly 500, but instead, there is linear radial movement of substrate blade assembly 540 to a position illustrated in FIG. 6.

Two substrates 502 are shown loaded on the substrate blade assembly 540 to illustrate that the individual substrate blades 520, 522 can be extended through individual substrate passages 132 in sidewall 133 of the transfer chamber 126 to transfer the substrates 502 into or out of the processing regions 618, 620 of the chambers 130. The magnetically coupled substrate handler 500 is controlled by the relative rotational motion of the magnet clamps 524, 526 corresponding to the relative speed of two motors. A first operational mode is provided in which both motors cause the magnet clamps 524, 526 to rotate in the same direction at the same speed. Because this mode causes no relative motion of the magnet clamps, the substrate handler will merely rotate about a central axis A, typically from a position suitable for substrate exchange with one pair of processing regions 618, 620 to a position suitable for substrate exchange with another pair of processing regions.

Furthermore, as the fully retracted substrate handler is rotated about the central axis A, the outermost radial points 548 along the edge of the substrate define a minimum circular region 550 required to rotate the substrate handler. The magnetically coupled substrate handler also provides a second mode in which both motors cause the magnet clamps 524, 526 to rotate in opposite directions at the same speed. This second mode is used to extend the substrate blades 520, 522 of the substrate blade assembly 540 through the passages 132 and into the processing regions 618, 620 or, conversely, to withdraw the blades therefrom. Other combinations of motor rotation can be used to provide simultaneous extension or retraction of the substrate blade assembly 540 as the substrate handler 500 is being rotated about axis A.

Figure 6:
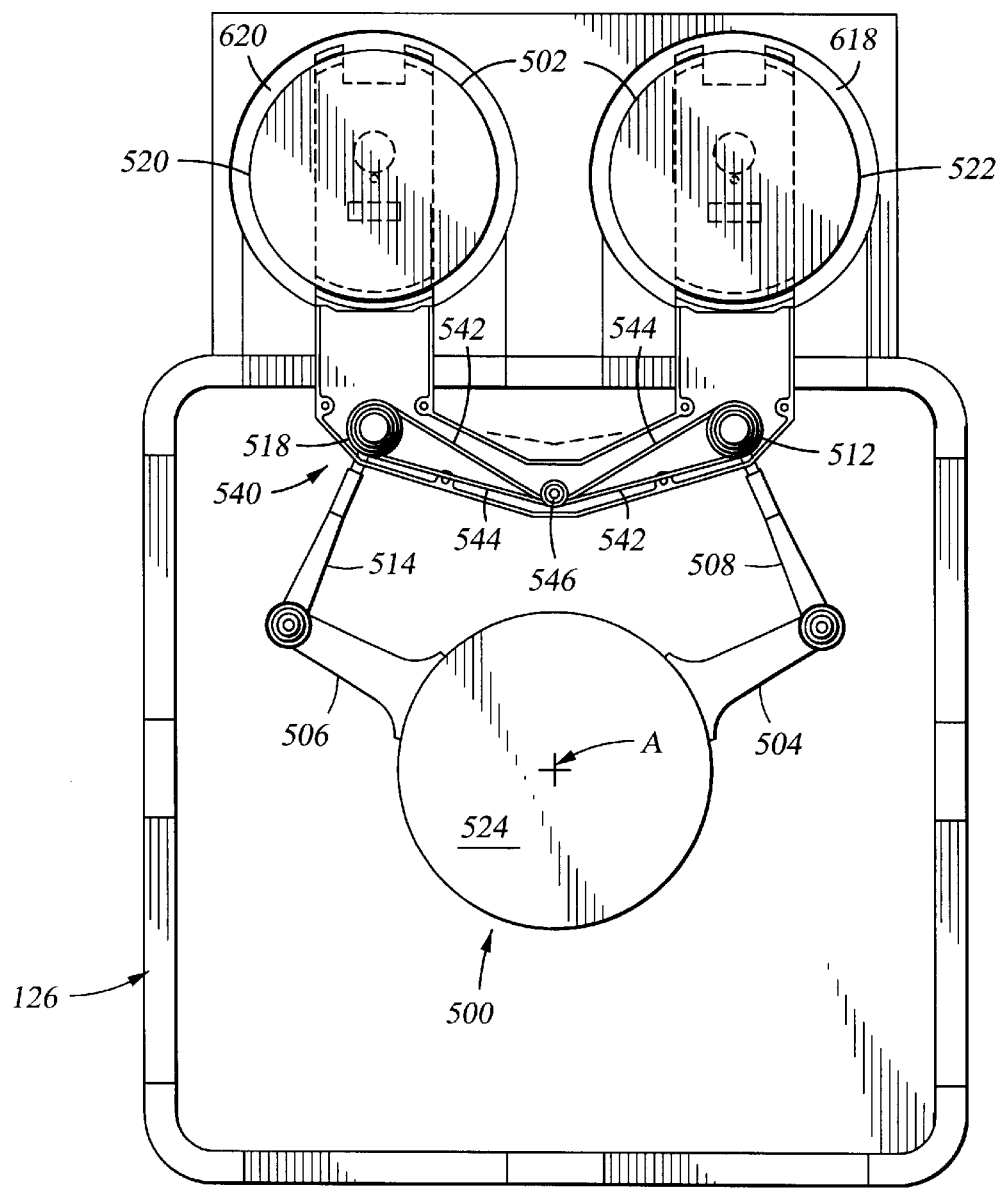
FIG. 6 is a top view of a transfer chamber and a processing chamber showing a substrate handling member of the present invention mounted in the transfer chamber and in an extended position wherein the blades are positioned in the processing chamber.

To keep the substrate blades 520, 522 of the substrate blade assembly 540 directed radially away from the rotational axis A, an interlocking mechanism is used between the pivots or cams 512, 518 to assure an equal and opposite angular rotation of each pivot. The interlocking mechanism may take on many designs, including intermeshed gears or straps pulled around the pivots in a figure-8 pattern or the equivalent. One preferred interlocking mechanism is a pair of metal straps 542 and 544 that are coupled to and extend between the pivots 512, 518 of the substrate blade assembly 540. The straps 542, 544 connect the pivots 512, 518. It is preferred that the straps 542, 544 be individually adjustable and positioned one above the other. In FIGS. 5 and 6, the straps are also shown passing around a rod 546 at the base of the U-shaped dual blade. When a dual bladed tandem substrate handler is used in transfer chamber 126, the above described substrate handler is preferably utilized.

FIG. 6 shows the substrate handler arms and blade assembly of FIG. 5 in an extended position. This extension is accomplished by the simultaneous and equal rotation of magnet clamp 526 in a clock-wise direction and magnet clamp 524 in a counter-clockwise rotation. The individual blades 520, 522 of the substrate blade assembly 540 are sufficiently long to extend through the passages 132 and center the substrates 502 over the pedestals 628 (See FIG. 8). Once the substrates 502 have been lifted from the blades by a pair of lift pin assemblies, then the blades are retracted and the passages 132 are closed by a slit valve and actuator as described above.

Stripping Chamber

Figure 7:
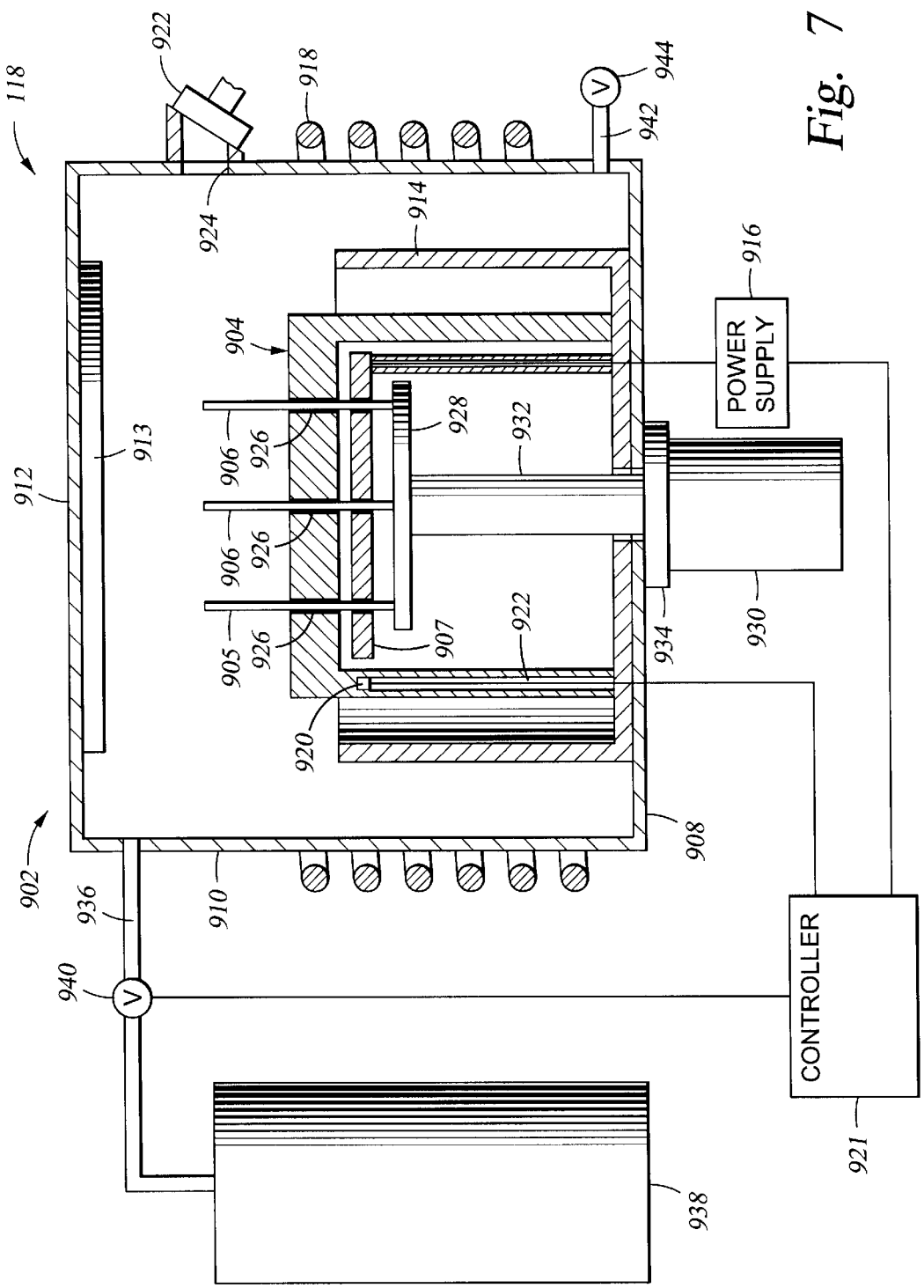
FIG. 7 is a cross sectional view of a rapid thermal anneal chamber.

FIG. 7 is a cross sectional view of an exemplary substrate stripping chamber of the invention. More particularly, FIG. 7 is a rapid thermal anneal chamber that is capable of both a non-reactive gas anneal and an oxidizing gas strip of a deposited film. The substrate stripping chamber or rapid thermal anneal (RTA) chamber 118 is preferably connected to the transfer chamber 108. The high pressure deposition module 101, as shown in FIGS. 2 and 3, preferably comprises two RTA chambers 118 preferably disposed on opposing sides of the transfer chamber 108 from the capping module 120, with the substrates are transferred into and out of the RTA chamber 118 by the substrate handler 112.

Thermal anneal process chambers are generally well known in the art, and rapid thermal anneal chambers are typically utilized in substrate processing systems to modify the properties of the deposited materials. According to the invention, the annealing chambers 118, are used to perform as a surfactant strip by a high temperature anneal in the presence of a reactant gas or an oxidation of the exposed film to remove the surfactant. One particular thermal anneal chamber useful for the present invention is the WxZ chamber available from Applied materials, Inc., located in Santa Clara, Calif. Although the invention is described using a hot plate rapid thermal anneal chamber, the invention contemplates application of other thermal anneal chambers suitable for carrying out the processes of the invention.

The RTA chamber 118 generally comprises an enclosure 902, a heater plate 904, a heater 907 and a plurality of substrate support pins 906. The enclosure 902 includes a base 908, a sidewall 910 and a top 912. Preferably, a cold plate 913 is disposed below the top 912 of the enclosure. Alternatively, the cold plate is integrally formed as part of the top 912 of the enclosure. Preferably, a reflector insulator dish 914 is disposed inside the enclosure 902 on the base 908. The reflector insulator dish 914 is typically made from a material such as quartz, alumina, or other material that can withstand high temperatures (i.e., greater than about 500° C.), and act as a thermal insulator between the heater 907 and the enclosure 902. The dish 914 may also be coated with a reflective material, such as gold, to direct heat back to the heater plate 906.

The heater plate 904 preferably has a large mass compared to the substrate being processed in the system and is preferably fabricated from a material such as silicon carbide, quartz, or other materials that do not react with any ambient gases in the RTA chamber 118 or with the substrate material. The heater 907 typically comprises a resistive heating element or a conductive/radiant heat source and is disposed between the heated plate 906 and the reflector insulator dish 914. The heater 907 is connected to a power source 916 which supplies the energy needed to heat the heater 907. Preferably, a thermocouple 920 is disposed in a conduit 922, disposed through the base 908 and dish 914, and extends into the heater plate 904. The thermocouple 920 is connected to a controller 921 and supplies temperature measurements to the controller 921. The controller 921 then increases or decreases the heat supplied by the heater 907 according to the temperature measurements and the desired anneal temperature.

The enclosure 902 preferably includes a cooling member 918 disposed outside of the enclosure 902 in thermal contact with the sidewall 910 to cool the enclosure 902. Alternatively, one or more cooling channels (not shown) are formed within the sidewall 910 to control the temperature of the enclosure 902. The cold plate 913 disposed on the inside surface of the top 912 cools a substrate that is positioned in close proximity to the cold plate 913.

The RTA chamber 118 includes a slit valve 922 disposed on the sidewall 910 of the enclosure 902 for facilitating transfers of substrates into and out of the RTA chamber 118. The slit valve 922 selectively seals an opening 924 on the sidewall 910 of the enclosure that communicates with the transfer chamber 108. The substrate handler 112 transfers substrates into and out of the RTA chamber through the opening 924.

The substrate support pins 906 preferably comprise distally tapered members constructed from quartz, aluminum oxide, silicon carbide, or other high temperature resistant materials. Each substrate support pin 906 is disposed within a tubular conduit 926, preferably made of a heat and oxidation resistant material, that extends through the heater plate 904. The substrate support pins 906 are connected to a lift plate 928 for moving the substrate support pins 906 in a uniform manner. The lift plate 928 is attached to an to an actuator 930, such as a stepper motor, through a lift shaft 932 that moves the lift plate 928 to facilitate positioning of a substrate at various vertical positions within the RTA chamber. The lift shaft 932 extends through the base 908 of the enclosure 902 and is sealed by a sealing flange 934 disposed around the shaft.

To transfer a substrate into the RTA chamber 118, the slit valve 922 is opened, and the loading station transfer substrate handler 228 extends its substrate handler blade having a substrate positioned thereon through the opening 924 into the RTA chamber. The substrate handler blade of the loading station transfer substrate handler 228 positions the substrate in the RTA chamber above the heater plate 904, and the substrate support pins 906 are extended upwards to lift the substrate above the substrate handler blade. The substrate handler blade then retracts out of the RTA chamber, and the slit valve 922 closes the opening. The substrate support pins 906 are then retracted to lower the substrate to a desired distance from the heater plate 904. Optionally, the substrate support pins 906 may retract fully to place the substrate in direct contact with the heater plate.

Preferably, a gas inlet 936 is disposed through the sidewall 910 of the enclosure 902 to allow selected gas flow into the RTA chamber 118 during the anneal treatment process. The gas inlet 936 is connected to a gas source 938 through a valve 940 for controlling the flow of the gas into the RTA chamber 118. The gas source 938 can provide a non-reactive gas for high temperature annealing or can be a remote unit providing an oxidizing gas, preferably a ozone plasma, to the annealing chamber 118 for oxidation of an exposed substrate film. A gas outlet 942 is preferably disposed at a lower portion of the sidewall 910 of the enclosure 902 to exhaust the gases in the RTA chamber and is preferably connected to a relief/check valve 944 to prevent backstreaming of atmosphere from outside of the chamber. Optionally, the gas outlet 942 is connected to a vacuum pump (not shown) to exhaust the RTA chamber to a desired vacuum level during an anneal treatment.

According to the invention, a substrate is annealed in the RTA chamber 118 after the deposition of an oxide film. Preferably, for a high temperature non-reactive gas anneal, the RTA chamber 118 is maintained at about atmospheric pressure, and the oxygen content inside the RTA chamber 118 is controlled to less than about 100 ppm during the anneal treatment process. Preferably, the ambient environment inside the RTA chamber 118 comprises nitrogen ($N_2$) or a combination of nitrogen ($N_2$) and less than about 4% hydrogen ($H_2$), and the ambient gas flow into the RTA chamber 118 is maintained at greater than 20 liters/min to control the oxygen content to less than 100 ppm. The substrate is annealed at a temperature between about 200° C. and about 450° C. for between about 30 seconds and 30 minutes, and more preferably, between about 400° C. and about 450° C. for between about 30 seconds and 5 minutes. Rapid thermal anneal processing typically requires a temperature increase of at least 50° C. per second. To provide the required rate of temperature increase for the substrate during the anneal treatment, the heater plate is preferably maintained at between about 350° C. and about 450° C., and the substrate is preferably positioned at between about 0 mm (i.e., contacting the heater plate) and about 20 mm from the heater plate for the duration of the anneal treatment process.

For an oxidation strip of the substrate, the RTA chamber 118 is maintained at about a pressure from about 1 Torr to about 10 Torr, with the oxidation gases composing oxygen or ozone at high temperatures, or an oxygen containing plasma. Preferably, the oxidation is preferably performed on substrate surfaces containing materials that are not sensitive to or reactive with oxygen. Preferably, the oxidizing gas flow into the RTA chamber 118 is maintained at a high flow rate, such as greater than (20) liters/min, to provide for a thorough oxygen strip of the exposed film on the substrate. During the oxygen strip process, the substrate is heated to a temperature between about 200° C. and about 450° C. for between about 30 seconds and 30 minutes, and more preferably, between about 350° C. and about 400° C. for between about 30 seconds and 5 minutes. The oxidizing gas is received from an oxygen source (not shown) that may also treat the gas to provide oxygen species from a remote plasma generator RF or a remote microwave generator (not shown).

After the stripping process is completed, the substrate support pins 906 lift the substrate to a position for transfer out of the RTA chamber 118. The slit valve 922 opens, and the substrate handler 112 of the transfer chamber 108 is extended into the RTA chamber and positioned below the substrate. The substrate support pins 906 retract to lower the substrate onto the substrate handler blade, and the substrate handler blade then retracts out of the RTA chamber.

Process Chambers

Figure 8:
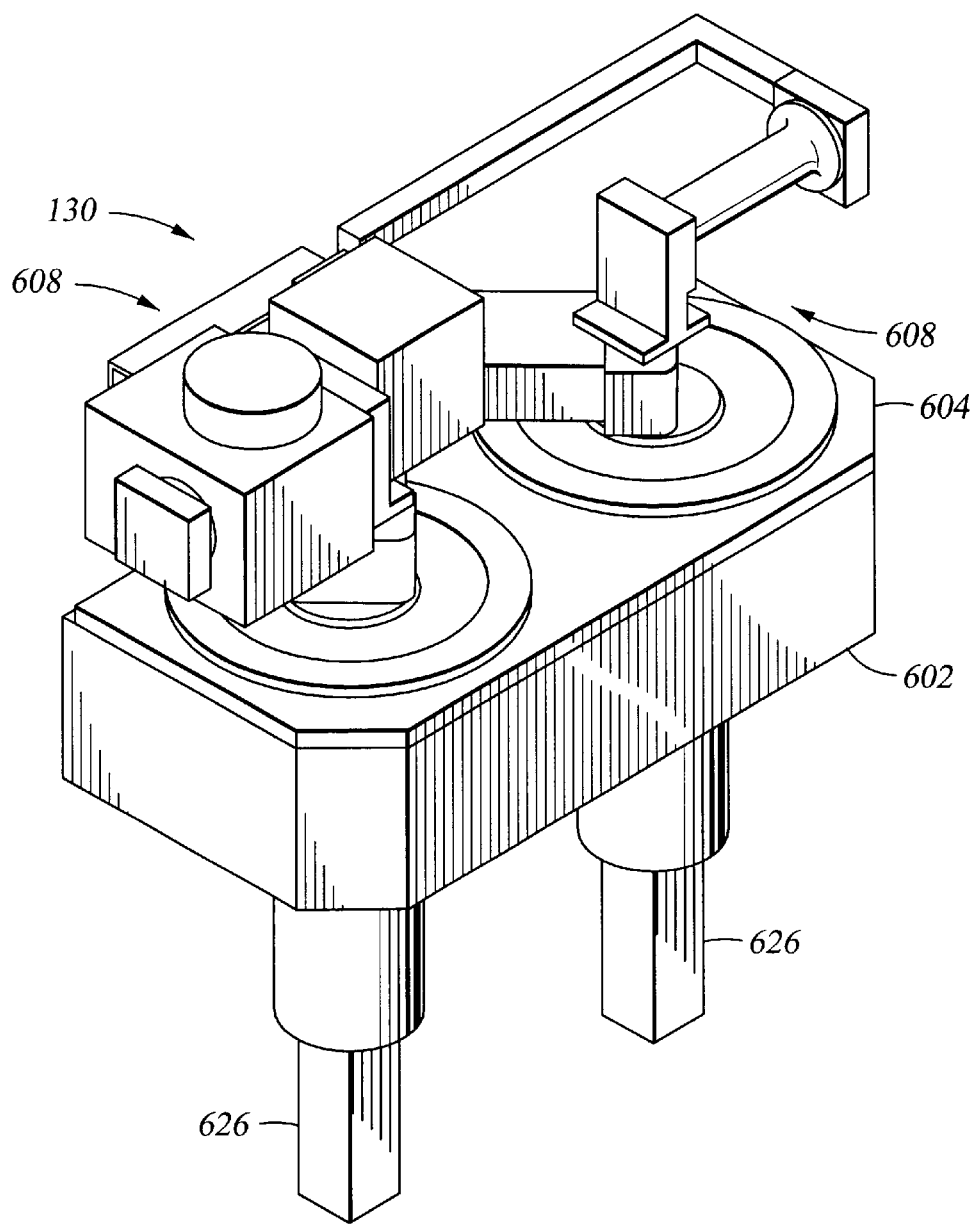
FIG. 8 is a perspective view of one embodiment of a PECVD chamber included in the capping module of the present invention.

FIG. 8 shows a perspective view of one embodiment of a tandem processing chamber 130. Chamber body 602 is mounted or otherwise connected to the transfer chamber 126 and includes two processing regions in which individual substrates are concurrently processed. The chamber body 602 supports a lid 604 which is hindgedly attached to the chamber body 602 and includes one or more gas distribution systems 608 disposed therethrough for delivering reactant and cleaning gases into multiple processing regions.

Figure 9:
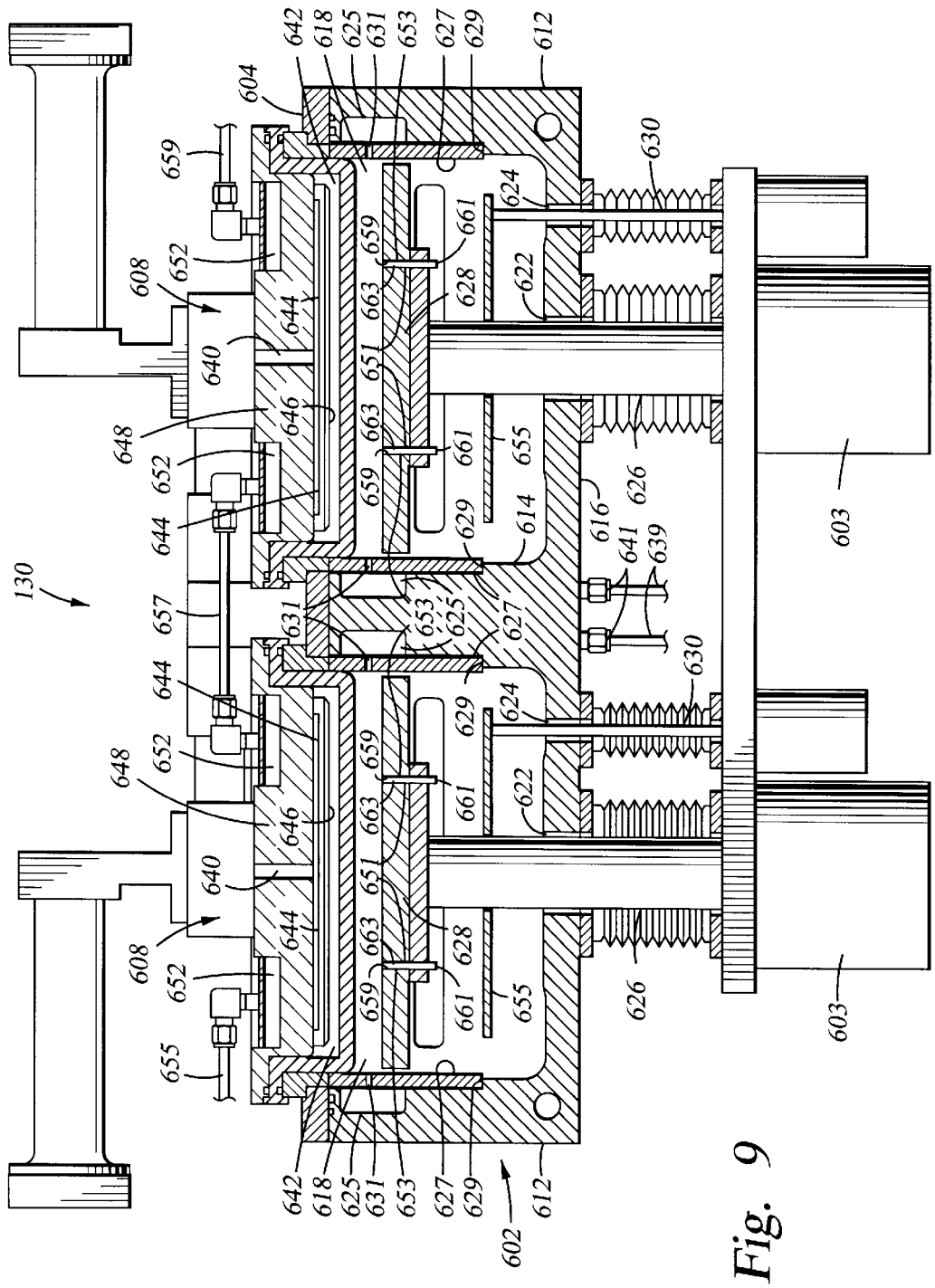
FIG. 9 is a cross sectional view of the PECVD chamber of the present invention.

FIG. 9 shows a schematic cross-sectional view of the chamber 126 defining two processing regions 618, 620. Chamber body 602 includes sidewall 612, interior wall 614 and bottom wall 616 which define the two processing regions 618, 620. The bottom wall 616 in each processing region 618, 620 defines at least two passages 622, 624 through which a stem 626 of a pedestal heater 628 and a rod 630 of a substrate lift pin assembly are disposed, respectively. A pedestal lift assembly and the substrate lift will be described in detail below.

The sidewall 612 and the interior wall 614 define two cylindrical annular processing regions 618, 620. A circumferential pumping channel 625 is formed in the chamber walls defining the cylindrical processing regions 618, 620 for exhausting gases from the processing regions 618, 620 and controlling the pressure within each region 618, 620. A chamber liner or insert 627, preferably made of ceramic or the like, is disposed in each processing region 618, 620 to define the lateral boundary of each processing region and to protect the chamber walls 612, 614 from the corrosive processing environment and to maintain an electrically isolated plasma environment between the electrodes. The liner 627 is supported in the chamber on a ledge 629 formed in the walls 612, 614 of each processing region 618, 620. The liner includes a plurality of exhaust ports 631, or circumferential slots, disposed therethrough and in communication with the pumping channel 625 formed in the chamber walls. Preferably, there are about twenty four ports 631 disposed through each liner 627 which are spaced apart by about 15° and located about the periphery of the processing regions 618, 620. While twenty four ports are preferred, any number can be employed to achieve the desired pumping rate and uniformity. In addition to the number of ports, the height of the ports relative to the face plate of the gas distribution system is controlled to provide an optimal gas flow pattern over the substrate during processing.

Figure 11:
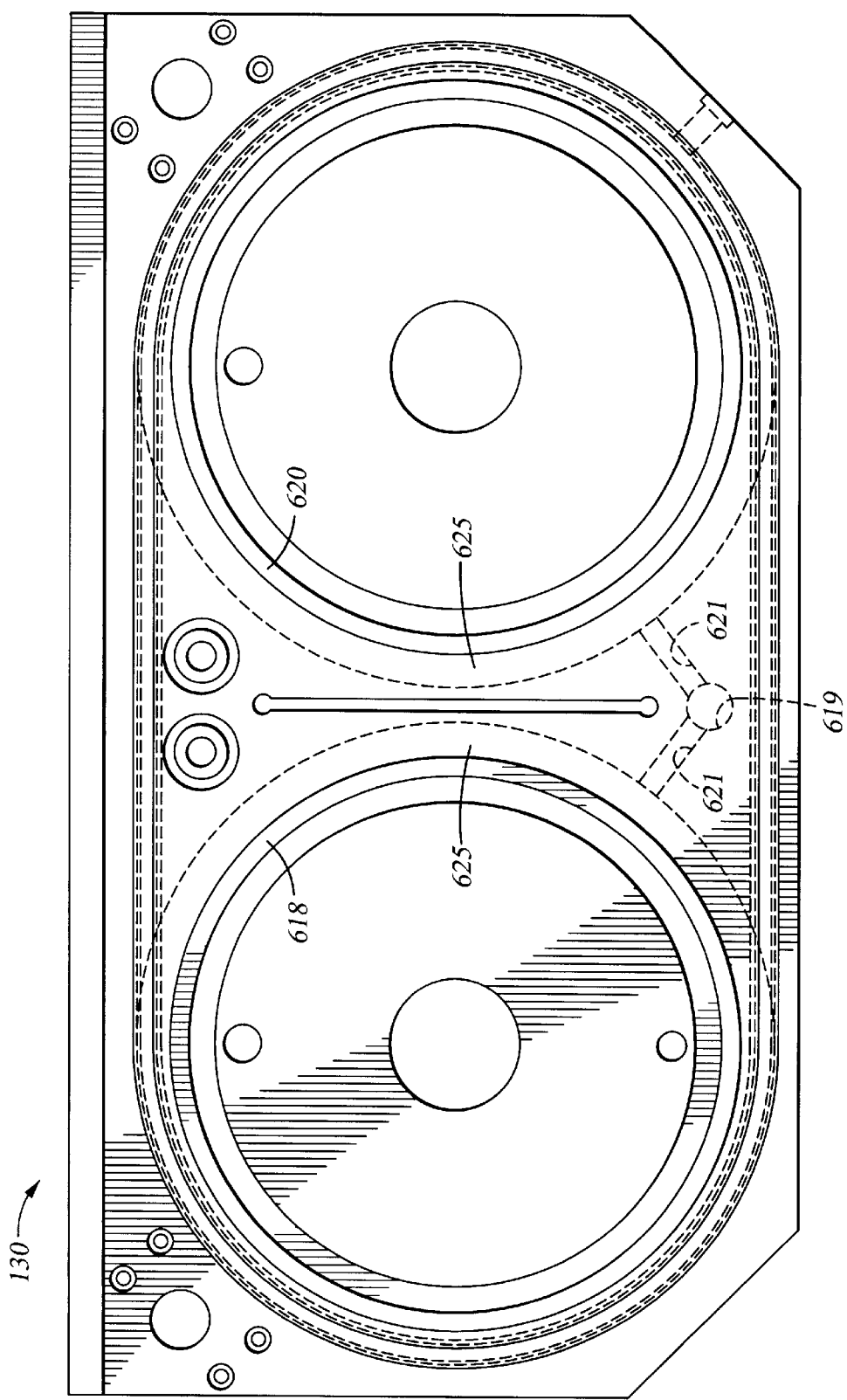
FIG. 11 is a top view of a PECVD chamber of the present invention with the lid removed.

FIG. 11 shows a cross sectional view of the chamber illustrating the exhaust system of the present invention. The pumping channels 625 of each processing region 618, 620 are preferably connected to a common exhaust pump via a common exhaust channel 619. The exhaust channel 619 is connected to the pumping channel 625 of each region 618, 620 by exhaust conduits 621. The exhaust channel 619 is connected to an exhaust pump (not shown) via an exhaust line (not shown). Each region is preferably pumped down to a selected pressure by the pump and the connected exhaust system allows equalization of the pressure within each region. The pump is preferably a high vacuum turbo pump capable of providing milliTorr pressures with very low vibration. One vacuum source used to advantage is available from Edward High Vacuum.

Referring back to FIG. 9, each of the processing regions 618, 620 also preferably include a gas distribution assembly 608 disposed through the chamber lid 604 to deliver gases into the processing regions 618, 620, preferably from the same gas source. The gas distribution system 608 of each processing region includes a gas inlet passage 640 which delivers gas into a shower head assembly 642. The shower head assembly 642 is comprised of an annular base plate 648 having a blocker plate 644 disposed intermediate a face plate 646. An RF feedthrough provides a bias potential to the showerhead assembly to facilitate generation of a plasma between the face plate 646 of the showerhead assembly and the heater pedestal 628. A cooling channel 652 is formed in a base plate 648 of each gas distribution system 608 to cool the plate during operation. An inlet 655 delivers a coolant fluid, such as water or the like, into the channels 652 which are connected to each other by coolant line 657. The cooling fluid exits the channel through a coolant outlet 659. Alternatively, the cooling fluid is circulated through the manifold.

Figure 10:
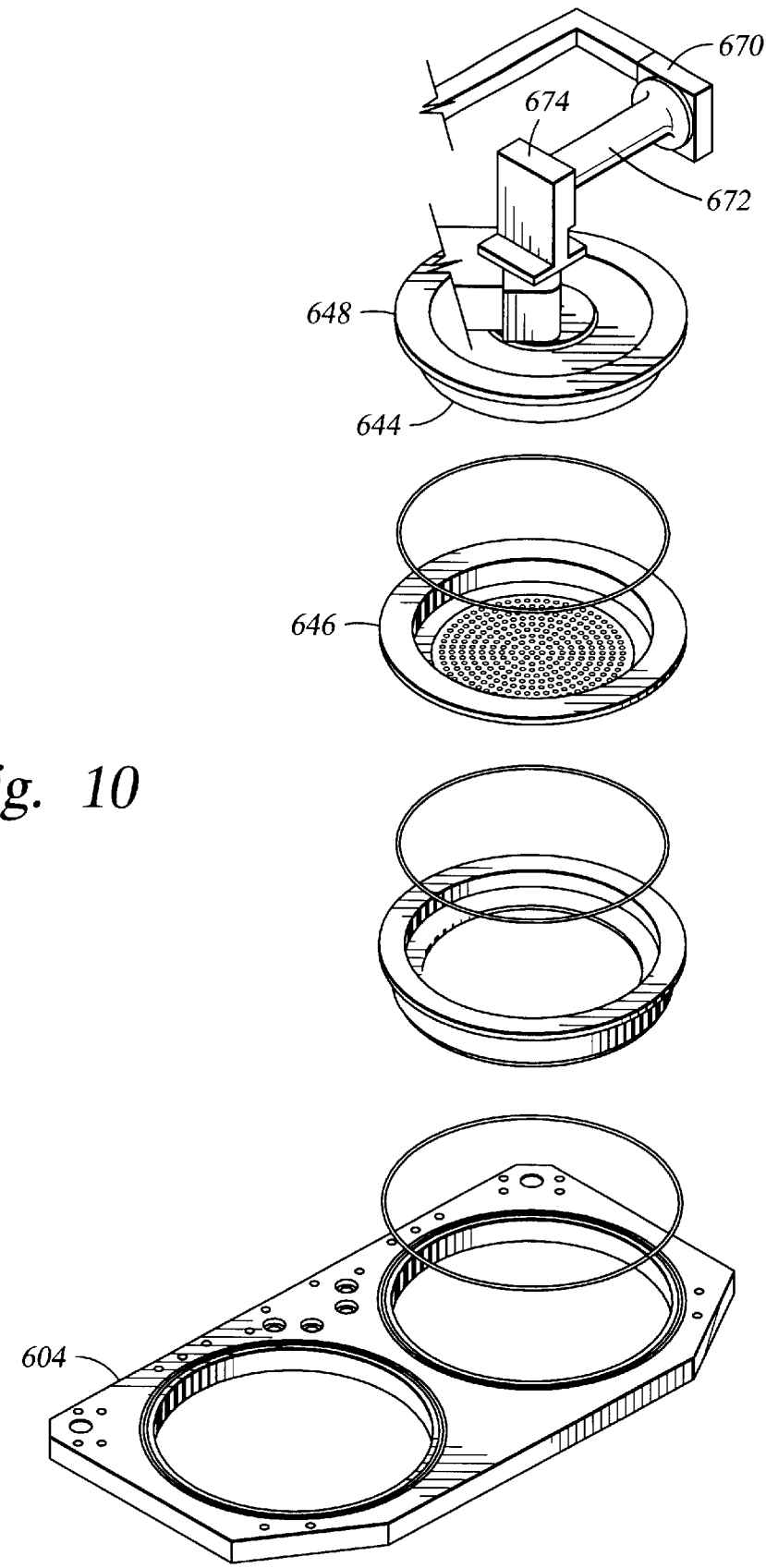
FIG. 10 is an exploded view of the gas distribution assembly for the PECVD chamber.

The chamber body 602 defines a plurality of vertical gas passages for each reactant gas and cleaning gas suitable for the selected process to be delivered in the chamber through the gas distribution system. Gas inlet connections 641 are disposed at the bottom of the chamber 126 to connect the gas passages formed in the chamber wall to the gas inlet lines 639. An o-ring is provided around each gas passage formed through the chamber wall on the upper surface of the chamber wall to provide sealing connection with the lid as shown in FIG. 11. The lid includes matching passages to deliver the gas from the lower portion of the chamber wall into a gas inlet manifold 670 positioned on top of the chamber lid as shown in FIG. 10. The reactant gases are delivered through a voltage gradient feed-through 672 and into a gas outlet manifold 674 which is connected to a gas distribution assembly.

The gas input manifold 670 channels process gases from the chamber gas feedthroughs into the constant voltage gradient gas feedthroughs, which are grounded. Gas feed tubes (not shown) deliver or route the process gases through the voltage gradient gas feedthroughs 672 and into the outlet manifold 674. Resistive sleeves surround the gas feed tubes to cause a linear voltage drop across the feedthrough preventing a plasma in the chamber from moving up the gas feed tubes. The gas feed tubes are preferably made of quartz and the sleeves are preferably made of a composite ceramic. The gas feed tubes are disposed within an isolating block which contains coolant channels to control temperature and prevent heat radiation and also to prevent liquefaction of process gases. Preferably, the insulating block is made of Delrin™ acetal resin. The quartz feed tubes deliver gas into a gas output manifold 674 which channels the process gases to the blocker plate 644 and into the gas distribution plate 646.

The gas input manifold 670 (see FIG. 10) also defines a passage which delivers cleaning gases from a chamber gas feedthrough into the remote plasma source (not shown). These gases bypass the voltage gradient feedthroughs and are fed into a remote plasma source where the gases are activated into various excited species. The excited species are then delivered to the gas distribution plate at a point just below the blocker plate through a conduit disposed in gas inlet passage 640.

The gas lines 639 which provide gas into the gas distribution systems of each processing region are preferably connected to a single gas source line and are therefore shared or commonly controlled for delivery of gas to each processing region 618, 620. The gas line(s) feeding the process gases to the multi-zone chamber are split to feed the multiple process regions by a t-type coupling. To facilitate flow into the individual lines feeding each process region, a filter, such as a sintered nickel filter, is disposed in the gas line upstream from the splitter. The filter enhances the even distribution and flow of gases into the separate gas feed lines.

The gas distribution system comprises a base plate 648 having a blocker plate 644 disposed adjacent to its lower surface. A face plate 646 is disposed below the blocker plate 644 to deliver the gases into the processing regions 618, 620. In one embodiment, the base plate 648 defines a gas passage therethrough to deliver process gases to a region just above the blocker plate 644. The blocker plate 644 disperses the process gases over its upper surface and delivers the gases above the face plate 646. The holes in the blocker plate 644 can be sized and positioned to enhance mixing of the process gases and distribution over the face plate 646. The gases delivered to the face plate 646 are then delivered into the processing regions 618, 6in a uniform manner over a substrate positioned for processing.

A gas feed tube (not shown) is positioned in the gas passage and is connected at one end to an output line from a remote plasma source. One end of the gas feed tube extends through the gas outlet manifold to deliver gases from the remote plasma source. The other end of the gas feed tube is disposed through the blocker plate 644 to deliver gases beyond the blocker plate 644 to the region just above the face plate 646. The face plate 646 disperses the gases delivered through the gas feed tube and then delivers the gases into the processing regions.

While this is a preferred gas distribution system, the gases from the remote plasma source can be introduced into the processing regions 618, 620 through a port (not shown) provided through the chamber wall. In addition, process gases could be delivered through any gas distribution system which is presently available, such as the gas distribution system available from Applied Materials, Inc. of Santa Clara, Calif.

Heater Pedestal

FIG. 9 shows a heater pedestal 628 which is movably disposed in each processing region 618, 620 by a stem 626 which is connected to the underside of a support plate and extends through the bottom of the chamber body 602 where it is connected to a drive system 603. The stem 626 is preferably a circular, tubular, aluminum member, having an upper end disposed in supporting contact with the underside of the heater pedestal 628 and a lower end closed off with a cover plate. The lower end of the stem is received in a cup shaped sleeve, which forms the connection of the stem to the drive system. The stem 626 mechanically positions the heater pedestal 628 within the processing region and also forms an ambient passageway through which a plurality of heater plate connections can extend. Each heater pedestal 628 may include heating elements to heat a substrate positioned thereon to a desired process temperature. The heating elements may include for example a resistive heating element. Alternatively, the heater pedestal may be heated by an outside heating element such as a lamp. A pedestal used to advantage in the present invention is available from Applied Materials, Inc., of Santa Clara, Calif. The pedestal may also support an electrostatic chuck, a vacuum chuck or other chucking device to secure a substrate thereon during processing.

The heater pedestal 628 is raised and lowered by moving the transfer housing up or down to a process, clean, lift and release position by a drive system 603 having linear electric actuators (not shown). The transfer housing is connected to the actuator on one side and a linear slide (not shown) on the other through a carriage plate (not shown). The connection between the actuator and the carriage is made via a flexible (ball and socket) joint (not shown) to allow for any misalignment. The linear slide and carriage plate are biased against one another to prevent rotation and bending thereof. A bellows surrounds the stem 626 of the heater pedestal 628 and connects to the chamber bottom 616 on one end and to the transfer housing on the other end. A seal ring (not shown is provided in a groove 630 in the stem 626 to seal the outer surface of the lower end of the stem in the sleeve 624. Leveling of the heater pedestal 628 with respect to the faceplate 646 is achieved with the use of three screws.

Alternatively, the drive system 603 includes a motor and reduction gearing assembly (not shown) suspended below the chamber 130 and connected to a drive belt to a conformable coupling and lead screw assembly. A transfer housing is received on the lead screw assembly, which is guided up and down and held against rotation by a linear slide. The heater lift mechanism is held against the chamber 130 with the drive collar. The heater pedestal 628 is raised and lowered by a lead screw which is driven by a stepper motor. The stepper motor is mounted to the heater lift assembly by a motor bracket. The stepper motor drives the lead screw in a bellows. The bellows turn the lead screw to raise or lower the heater assembly to the process, lift and release positions. A seal ring is provided in a groove in the stem 626 to seal the outer surface of the lower end of the stem 626 in the sleeve.

Substrate Positioning Assembly

Referring to FIGS. 8 and 9, the stem 626 moves upwardly and downwardly in the chamber to move the heater pedestal 628 to position a substrate thereon or remove a substrate therefrom for processing. A substrate positioning assembly includes a plurality of support pins 651 which move vertically with respect to the heater pedestal 628 and are received in bores 653 disposed vertically through the pedestal. Each pin 651 includes a cylindrical shaft 659 terminating in a lower spherical portion 661 and an upper truncated conical head 663 formed as an outward extension of the shaft. The bores 653 in the heater pedestal 628 include an upper, countersunk portion sized to receive the conical head 663 therein such that when the pin 651 is fully received into the heater pedestal 628, the head does not extend above the surface of the heater pedestal.

The lift pins 651 move partially in conjunction with, and partially independent of, the heater pedestal 628 as the pedestal moves within the processing region. The lift pins can extend above the pedestal 628 to allow the substrate handler blade to remove the substrate from the processing region, but must also sink into the pedestal to locate the substrate on the upper surface of the pedestal for processing. To move the pins 651, the substrate positioning assembly includes an annular pin support 655 which is configured to engage lower spherical portions 661 of the lift pins 651 and a drive member which positions the pin support 655 to selectively engage the lift pins 651 depending on the position of the heater pedestal 628 within the processing region. The pin support 655, preferably made from ceramic, extends around the stem 626 below the heater pedestal 628 to selectively engage the lower spherical portions of the support pins.

A drive assembly lifts and lowers the shaft 630 and connected pin support 655 to move the pins 651 upwardly and downwardly in each processing region 618, 620. The pin drive member is preferably located on the bottom of the chamber 130 to control the movement of the pin support platform 655 with respect to the pedestal heater 628.

Gas Box and Supply

Referring to FIGS. 2 and 3, on the outside of the chamber on the back end of the system, there is a gas supply panel 219 containing the gases that are to be used during deposition and cleaning. The particular gases that are used depend upon the materials to be deposited onto the substrate or removed from the chamber 130. The process gases flow through an inlet port into the gas manifold and then into the chamber through a shower head type gas distribution assembly. An electronically operated valve and flow control mechanism control the flow of gases from the gas supply into the chamber.

In one embodiment of the invention the precursor gases are delivered from the gas box 219 to the chamber 130 where the gas line tees into two separate gas lines which feed gases through the chamber body as described above. Depending on the process, any number of gases can be delivered in this manner and can be mixed either before they are delivered to the bottom of the chamber or once they have entered the gas distribution plate.

Power Supplies

Referring to FIGS. 2 and 3, an advanced compact RF ("CRF") power delivery system 136 is used for each processing region 618, 620 with one system connected to each gas distribution system 219. A 13.56 MHz RF generator, Genesis Series, manufactured by ENI, is mounted on the back end of the system for each chamber. This high frequency generator is designed for use with a fixed match and regulates the power delivered to the load, eliminating the concern about forward and reflected power. To interface a high frequency RF generator and a low frequency RF generator to a process chamber, a low pass filter is designed into the fixed match enclosure.

A 350 kHz RF generator manufactured by ENI, is located in an RF generator rack on the back end of the system and linked to the fixed RF match by coaxial cable. The low frequency RF generator provides both low frequency generation and fixed match elements in one compact enclosure. The low frequency RF generator regulates the power delivered to the load reducing the concern about forward and reflected power.

Programming

The system controller 138 shown in FIGS. 2 and 3 operates under the control of a computer program stored on the hard disk drive of a computer. The computer program dictates the process sequencing and timing, mixture of gases, chamber pressures, RF power levels, susceptor positioning, slit valve opening and closing, substrate heating and other parameters of a particular process. The interface between a user and the system controller is preferably via a CRT monitor and lightpen (not shown). In a preferred embodiment two monitors are used, one monitor mounted in the clean room wall for the operators and the other monitor behind the wall for the service technicians. Both monitors simultaneously display the same information but only one lightpen is enabled. The lightpen detects light emitted by the CRT display with a light sensor in the tip of the pen. To select a particular screen or function, the operator touches a designated area of the display screen and pushes the button on the pen. The display screen generally confirms communication between the lightpen and the touched area by changing its appearance, i.e. highlight or color, or displaying a new menu or screen.

A variety of processes can be implemented using a computer program product that runs on, for example, the system controller 138. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled library routines. To execute the linked compiled object code, the system user invokes the object code, causing the computer system to load the code in memory, from which the CPU reads and executes the code to perform the tasks identified in the program.

Figure 12:
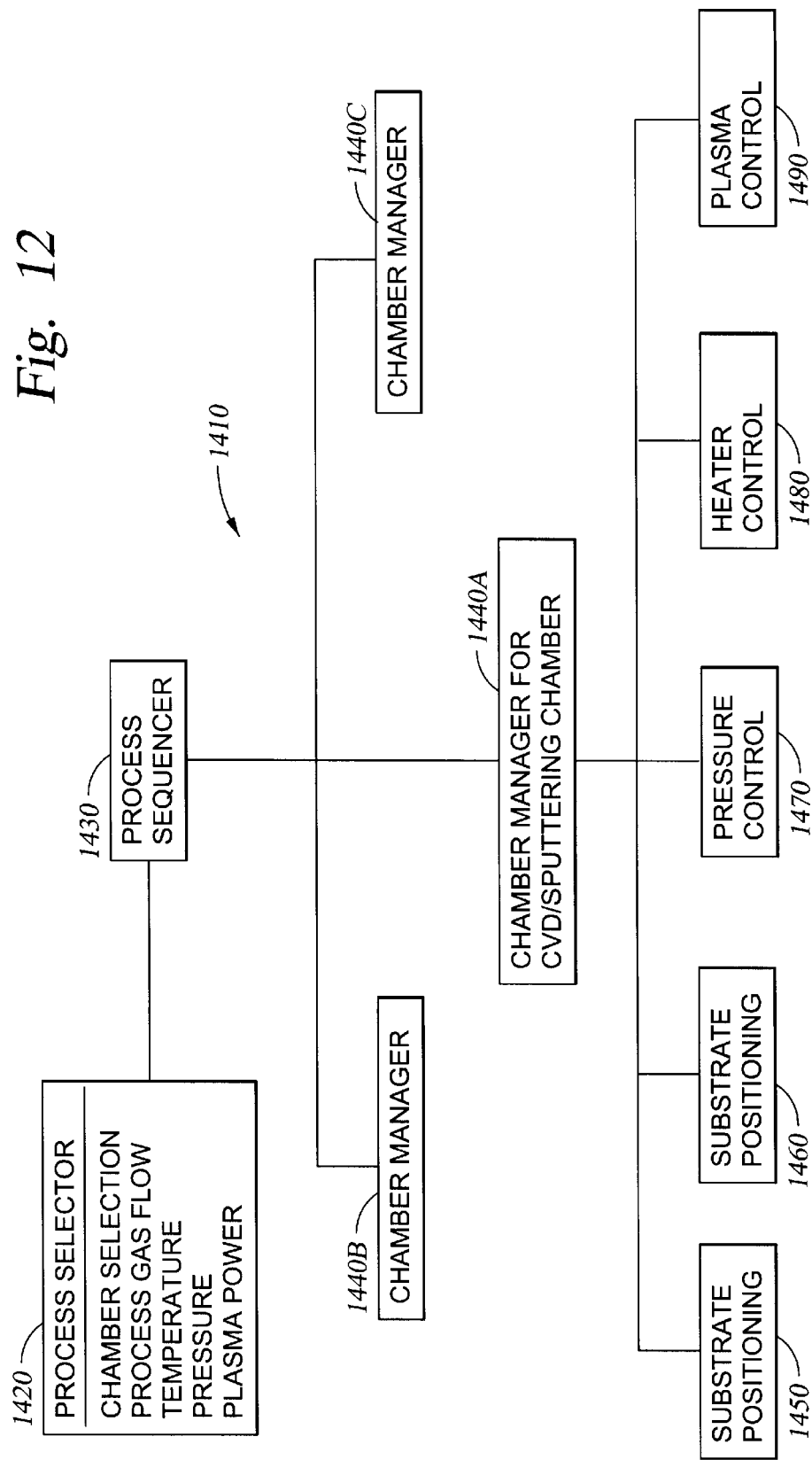
FIG. 12 is an illustrative block diagram of the hierarchical control structure of a computer program for process control.

FIG. 12 shows an illustrative block diagram of a preferred hierarchical control structure of the computer program 1410. A user enters a process set number and process chamber number into a process selector subroutine 1420 in response to menus or screens displayed on the CRT monitor by using the lightpen interface. The process sets provide predetermined sets of process parameters necessary to carry out specified processes, and are identified by predefined set numbers. The process selector subroutine 1420 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered in any conventional manner, but most preferably by utilizing the lightpen/CRT monitor interface.

Electronic signals provided by various instruments and devices for monitoring the process are provided to the computer through the analog input and digital input boards of the system controller. Any conventional method of monitoring the process chambers can be used, such as polling. Furthermore, electronic signals for operating various process controllers or devices are output through the analog output and digital output boards of the system controller. The quantity, type and installation of these monitoring and controlling devices may vary from one system to the next according to the particular end use of the system and the degree of process control desired. The specification or selection of particular devices, such as the optimal type of thermocouple for a particular application, is known by persons with skill in the art.

A process sequencer subroutine 1430 comprises program code for accepting the identified process chamber number and set of process parameters from the process selector subroutine 1420, and for controlling operation of the various process chambers. Multiple users can enter process set numbers and process chamber numbers, or a user can enter multiple process chamber numbers, so the sequencer subroutine 1430 operates to schedule the selected processes in the desired sequence. Preferably, the process sequencer subroutine 1430 includes program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. When scheduling which process is to be executed, the sequencer subroutine 1430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 1430 determines which process chamber and process set combination is going to be executed next, the sequencer subroutine 1430 causes execution of the process set by passing the particular process set parameters to a chamber manager subroutine 1440a–c which controls multiple processing tasks in a process chamber 130 according to the process set determined by the sequencer subroutine 1430. For example, the chamber manager subroutine 1440a comprises program code for controlling sputtering and CVD process operations in the process chamber 130. The chamber manager subroutine 1440 also controls execution of various chamber component subroutines which control operation of the chamber component necessary to carry out the selected process set. Examples of chamber component subroutines are substrate positioning subroutine 1450, process gas control subroutine 1460, pressure control subroutine 1470, heater control subroutine 1480, and plasma control subroutine 1490. Those having ordinary skill in the art will recognize that other chamber control subroutines can be included depending on what processes are desired to be performed in the process chamber 130. In operation, the chamber manager subroutine 1440a selectively schedules or calls the process component subroutines in accordance with the particular process set being executed. The chamber manager subroutine 1440a schedules the process component subroutines similarly to how the sequencer subroutine 1430 schedules which process chamber 130 and process set is to be executed next. Typically, the chamber manager subroutine 1440a includes steps of monitoring the various chamber components, determining which components need to be operated based on the process parameters for the process set to be executed, and causing execution of a chamber component subroutine responsive to the monitoring and determining steps.

Operation of particular chamber components subroutines will now be described with reference to FIG. 12. The substrate positioning subroutine 1450 comprises program code for controlling chamber components that are used to load the substrate onto the pedestal 628, and optionally to lift the substrate to a desired height in the chamber 130 to control the spacing between the substrate and the showerhead 642. When substrates are loaded into the chamber 130, the pedestal 628 is lowered and the lift pin assembly is raised to receive the substrate and, thereafter, the pedestal 628 is raised to the desired height in the chamber, for example to maintain the substrate at a first distance or spacing from the gas distribution manifold during the CVD process. In operation, the substrate positioning subroutine 1450 controls movement of the lift assembly and pedestal 628 in response to process set parameters related to the support height that are transferred from the chamber manager subroutine 1440a.

The process gas control subroutine 1460 has program code for controlling process gas composition and flow rates. The process gas control subroutine 1460 controls the open/close position of the safety shut-off valves, and also ramps up/down the mass flow controllers to obtain a desired gas flow rate. The process gas control subroutine 1460 is invoked by the chamber manager subroutine 1440a, as are all chamber components subroutines, and receives from the chamber manager subroutine process parameters related to the desired gas flow rate. Typically, the process gas control subroutine 1460 operates by opening a single control valve between the gas source and the chamber 130 gas supply lines, and repeatedly (i) measuring the mass flow rate, (ii) comparing the actual flow rate to the desired flow rate received from the chamber manager subroutine 1440a, and (iii) adjusting the flow rate of the main gas supply line as necessary. Furthermore, the process gas control subroutine 1460 includes steps for monitoring the gas flow rate for an unsafe rate, and activating a safety shut-off valve when an unsafe condition is detected.

In some processes, an inert gas such as argon is provided into the chamber 130 to stabilize the pressure in the chamber before reactive process gases are introduced into the chamber. For these processes, the process gas control subroutine 1460 is programmed to include steps for flowing the inert gas into the chamber 130 for an amount of time necessary to stabilize the pressure in the chamber, and then the steps described above would be carried out. Additionally, when a process gas is to be vaporized from a liquid precursor, for example tetraethylorthosilicate (TEOS), the WY process control subroutine 1460 would be written to include steps for bubbling a delivery gas such as helium through the liquid precursor in a bubbler assembly. For this type of process, the process gas control subroutine 1460 regulates the flow of the delivery gas, the pressure in the bubbler, and the bubbler temperature in order to obtain the desired process gas flow rates. As discussed above, the desired process gas flow rates are transferred to the process gas control subroutine 1460 as process parameters. Furthermore, the process gas control subroutine 1460 includes steps for obtaining the necessary delivery gas flow rate, bubbler pressure, and bubbler temperature for the desired process gas flow rate by accessing a stored data table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 1470 comprises program code for controlling the pressure in the chamber 130 by regulating the size of the opening of the throttle valve in the exhaust system of the chamber. The size of the opening of the throttle valve is varied to control the chamber pressure at a desired level in relation to the total process gas flow, the gas-containing volume of the process chamber, and the pumping set point pressure for the exhaust system. When the pressure control subroutine 1470 is invoked, the desired set point pressure level is received as a parameter from the chamber manager subroutine 1440a. The pressure control subroutine 1470 operates to measure the pressure in the chamber 130 using one or more conventional pressure manometers connected to the chamber, compare the measured value(s) to the set point pressure, obtain PID (proportional, integral, and differential) control parameters from a stored pressure table corresponding to the set point pressure, and adjust the throttle valve according to the PID values obtained from the pressure table. Alternatively, the pressure control subroutine 1470 can be written to open or close the throttle valve to a particular opening size to regulate the chamber 130 to the desired pressure.

The heater control subroutine 1480 comprises program code for controlling the temperature of the lamp or heater module that is used to heat the substrate. The heater control subroutine 1480 is also invoked by the chamber manager subroutine 1440a and receives a desired, or set point, temperature parameter. The heater control subroutine 1480 determines the temperature by measuring voltage output of a thermocouple located in a pedestal 628, compares the measured temperature to the set point temperature, and increases or decreases current applied to the heater to obtain the set point temperature. The temperature is obtained from the measured voltage by looking up the corresponding temperature in a stored conversion table, or by calculating the temperature using a fourth order polynomial. When radiant lamps are used to heat the pedestal 628, the heater control subroutine 1480 gradually controls a ramp up/down of current applied to the lamp. The gradual ramp up/down increases the life and reliability of the lamp. Additionally, a built-in-fail-safe mode can be included to detect process safety compliance, and can shut down operation of the lamp or heater module if the process chamber 130 is not properly set up.

The plasma control subroutine 1490 comprises program code for setting the RF bias voltage power level applied to the process electrodes in the chamber 130, and optionally, to set the level of the magnetic field generated in the chamber. Similar to the previously described chamber component subroutines, the plasma control subroutine 1490 is invoked by the chamber manager subroutine 1440a.

While the system of the present invention was described above with reference to a plasma enhanced CVD application, it is to be understood that the invention also includes the use of high density (HDP) CVD and PVD chambers as well as etch chambers. For example, the system of the present invention can be adapted to include tandem HDP CVD chambers for plasma processing. In one alternative embodiment, the gas distribution/lid assembly could be replaced with a dielectric dome having an inductive coil disposed about the dome and an RF power supply connected to the coil to enable inductive coupling of a high density plasma within the chamber. Similarly, tandem PVD chambers could be configured with a target assembly disposed thereon for a deposition material source. DC power supplies could be connected the target assemblies to provide sputtering power thereto.

Phosphorus Doped Mesoporous Oxide Films

Figure 13:
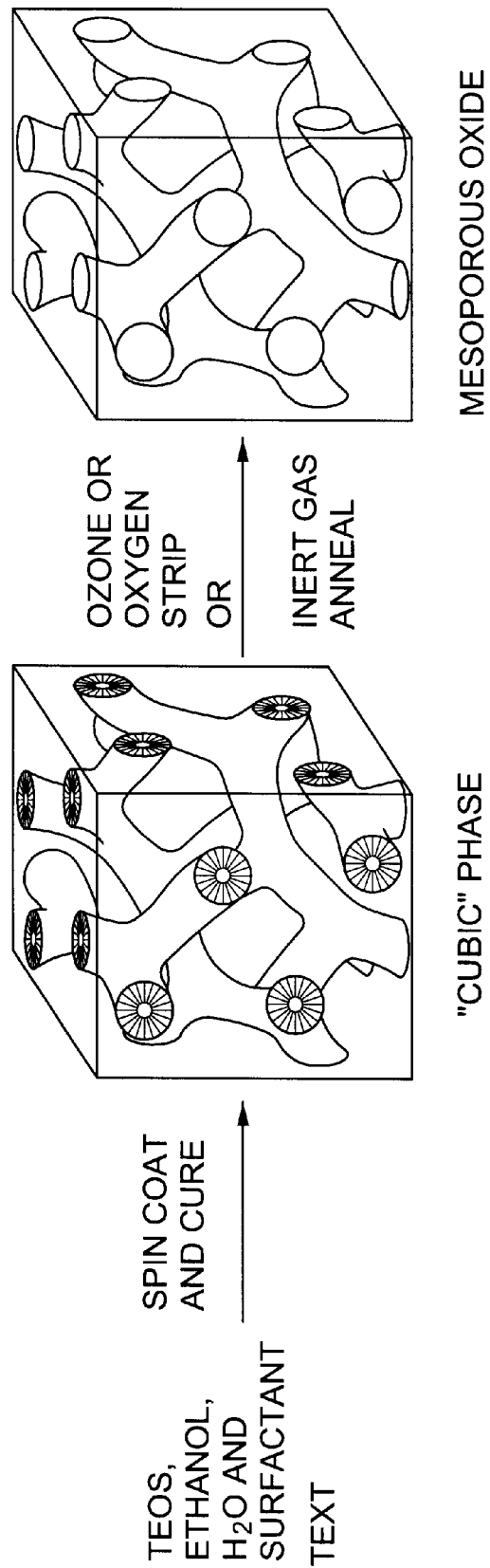
FIG. 13 is an illustrative view of the mesoporous film process showing cubic phase structure and mesoporous film structure.

FIG. 13 illustrates a process for forming a phosphorus doped mesoporous oxide dielectric on a substrate. The process includes depositing a phosphorus doped sol-gel precursor solution containing a surfactant on a substrate, curing the deposited sol-gel to form an oxide film, and exposing the film to an oxidizing environment, such as oxygen or ozone, or an inert annealing process to remove the surfactant and form a phosphorus doped mesoporous oxide dielectric film. Preferably, the phosphous is incorporated into the oxide film by the formation of a phosphorus compound, such as phosphorus pentaoxide, from the phosphorus contained in the sol-gel precursor solution. The sol-gel precursor solution is preferably formed using a phosphorus based acid catalyst, but may be formed with, or further include, a silicon/oxygen compound having a phosphorous acid ligand or a surfactant modified by a phosphorus based component. Other phosphorus based materials may be substituted in several of the process steps to achieve various effects, and processing parameters such as times, temperatures, pressures, and relative concentrations of materials may be varied over broad ranges.

The process begins in a high pressure deposition module by the formation of a sol-gel precursor. The sol-gel precursors used to deposit phosphorus doped films are formed by the mixture of a silicon/oxygen compound, water, a phosphorus containing acid, and a surfactant in an organic solvent. The sol-gel precursor is then applied to the substrate by either a spin-on coating or spray-coating method, but preferably by a spin-on coating deposition process. During spin-on coating, centrifugal draining allows the film to substantially cover the substrate in a thin layer of sol-gel precursor. Once deposited, the sol-gel precursor on the substrate is then thermally treated using a ramped increasing temperature profile from between about 80° C. to about 140° C. to complete hydrolytic condensation and to remove solvent and water from the sol-gel to form interconnecting pores of uniform diameter, preferably in a cubic phase structured film.

Next, the film is calcinated by exposure to a surfactant removing environment, such as a nitrogen anneal or an oxidizing atmosphere, which is preferably maintained at a temperature of about 350° C. to about 400° C., wherein the surfactant is removed from the film and is transformed into a phosphorus doped mesoporous oxide film. A preferred phosphorus to silicon ratio in a deposited film is between about 1:60 and about 1:8, preferably between about 1:30 and about 1:20. This corresponds to a weight percent of a phosphorus compound, such as phosphorus pentaoxide ($P_2O_5$,) in the silicon oxide film of between about 2% and about 8% by weight, and more preferably at about 4% by weight. The preferred concentrations of the phosphorus (phosphorous oxide) in the film is believed to provide effective immobilization, or gettering, of low concentrations of charged mobile atoms, thereby inhibiting mobile ion transport through the dielectric film. It is believed that the phosphorus doping advantageously provides the combined benefits of ion mobilization, acceleration of deposited hydrolysis completion, and condensation and improved film strength.

The silicon/oxygen compounds of the sol-gel precursor are those conventionally used in the deposition of silicon containing layers in semiconductor manufacturing, wherein silica sols are most preferably used. The silicon/oxygen precursor compounds tetraethylorthosilicate (TEOS), phenyltriethoxy silane, p-bis(triethoxysilyl)benzene, bis(triethoxysilyl)methane, methyltriethoxysilane, hexaethoxydisilane, and combinations thereof are preferably used. A phosphorus based acid may be chemically reacted with the silicon/oxygen compound prior to forming the sol-gel precursor to form a phosphorus doped silicon/oxide compound. Preferably, a phosphonic acid ligand, —PO(OH)$_2$, is combined with silicon/oxygen compounds such as a triethoxysilane group, $(CH_3CH_2O)_3Si$—, to produce o-phosphotriethoxysilane, $(CH_3CH_2O)_3SiOPO(OH)_2$. Other preferred phosphorus doped silicon/oxide compounds formed with the phosphoric acid type ligand include:

o-phosphoethylenetriethoxysilane $(CH_3CH_2O)_3SiCH_2CH_2OPO(OH)_2$, phosphorylethylenetriethoxysilane $(CH_3CH_2O)_3SiCH_2CH_2PO(OH)_2$, p-phosphorylphenylenetriethoxysilane $(CH_3CH_2O)_3Si(C_6H_4)PO(OH)_2$, phosphonotriethoxysilyl ketone $(CH_3CH_2O)_3SiC(O)PO(OH)_2$, and phosphonotriethoxysilane, $(CH_3CH_2O)_3SiPO(OH)_2$.

The phosphorus doped mesoporous oxide film is primarily doped by the use of a phosphorus based acid or acid derivative. It is believed that the phosphorus based acid ligand acts as a catalyst for the silicon/oxide precursor hydrolyzation, or polymerization, followed by completion of the hydrolytic condensation reaction at an elevated temperature to form oxysilanols, silicic acid, and siloxane condensates which coat the amphiphilic groups in the sol-gel process. The catalyst accelerates hydrolysis by lowering the hydrolysis activation energy, and increasing the subsequent condensation rate, thereby decreasing the time period for film processing. Further, phosphorus is incorporated into these compounds forming over the amphiphilic groups during the drying process, and subsequently dopes the forming film during post-treatment of the deposited sol-gel to remove the amphiphilic templates from the film. Preferred acids containing phosphorus compounds include orthophosphoric acid ($H_3PO_4$), ammonium dihydrogen phosphate, tetramethylammonium dihydrogen phosphate, phosphate esters of long-chain alcohols, alkoxysilylphosphonates, substituted derivatives thereof, and combinations thereof.

The phosphorus based acid may comprise the acid catalyst, or alternatively constitute a fraction of the acid catalyst. When the phosphorus based acid is used with additional acids, preferably organic acids selected from the group of oxalic acid, glyoxylic acid, and combinations thereof, and/or volatile inorganic acids selected from the group of nitric acid, hydrochloric acid, perchloric acid, and combinations thereof, are used. The use of highly volatile inorganic acids is of particular interest in forming mesoporous oxide films. Since acid-catalyzed hydrolysis reaction rates are at a maximum near a pH of about 2, and condensation rates are at a maximum near a pH between about 6 and about 7, a mixture of a phosphorus based acid, typically a weak acid with low volatility, and an inorganic acid, typically a strong acid with high volatility, may be used to maximize the catalytic reaction.

In particular, it is believed that the hydrolysis reaction is catalyzed by both the phosphorus based acid and the inorganic acid, preferably nitric acid, at a low pH, then exposure to an elevated temperature, such as in the curing step, volatilizes the nitric acid component, to produce a phosphorus based acid content to subsequently catalyze condensation and to impart phosphorus doping in the mesoporous oxide film. By controlling the relative concentrations of the acids in the acid mixture, a preferred amount of doping of the film can be achieved.

Surfactants are used in sol-gel precursors to ensure effective dispersion of the silicon/oxygen compounds in the solution for even film content deposition on the substrate. Surfactants may be anionic, cationic, or non-ionic. Surfactants use bonding groups that are hydrophilic to ensure a thorough dispersion in a solvent containing water. Non-ionic surfactants have chemical bonding groups that are uncharged or neutral hydrophilic groups while anionic and cationic surfactants have bonding groups respectfully charged negatively and positively. For the formation of the interconnecting pores of uniform diameter, preferably in a cubic phase structure of the invention, a non-ionic surfactant is used and is preferably selected from the group of p-$(CH_3)_3C$—$CH_2$—$C_6H_4$—$CH_2$—$(OCH_2CH_2)_8OH$, p-$(CH_3)_3COC_6H_4CH_2(OCH_2CH_2)_8$—OH and other polyethylene oxide co-polymer derivatives, polyethylene oxide-polypropylene oxide-polyethylene oxide triblock copolymer derivatives, and combinations thereof.

A phosphorus acid ligand may be chemically combined with the surfactant. For example, phosphate esters can be formed from the alcohol-terminated surfactants, which can include long chain hydrophilic chain structures, preferably selected from the group comprising p-$(CH_3)_3CCH_2C_6H_4CH_2(OCH_2CH_2)_N$—OH, p-$(CH_3)_3COC_6H_4CH_2(OCH_2CH_2)_N$—OH, $CH_3(CH_2)_K$—OH, the Triton™ surfactants, exemplified by $(CH_3)_3CCH_2C(CH_3)_2C_6H_4(OCH_2CH_2)_N$—OH, $CH_3(CH_2)_K$—OH HO$(CH_2CH_2O)_M(CH_2C(CH3)HO)_L(CH_2CH_2O)_M$H, and $CH_3(CH_2)_I(CH_2CH_2O)_J$—OH, with the and fluorinated derivatives thereof, and combinations thereof. Preferably, N is an integer from 6 to 12, most preferably 8, K is an integer from 13 to 17, I is an integer from 6 to 15, J is an integer from 20 to 106, and L is an integer from 20 to 80. Examples of these compounds include tetradecyl phosphate and hexadecyl (cetyl) phosphate.

An organic solvent is used in the solution to help provide for silicon/oxygen compound dispersion in the sol-gel and for ease in spraying or depositing the sol-gel on the substrate in the spinner chamber. The present invention uses organic solvents, preferably alcohols, selected from the group of ethanol, n-propanol, iso-propanol, n-butanol, sec-butanol, tert-butanol, ethylene glycol, or combinations thereof, but preferably 1-propanol, iso-propanol, and 2-butanol are used. The organic solvent in the deposited sol-gel is typically removed by a thermal treatment, or curing process, that may comprise one or more steps between about 50° C. and about 450° C. to provide an environment for the hydrolysis and condensation reactions to occur in forming the film. The curing process is preferably performed for about one minutes to about ten minutes in a curing/baking chamber.

During the curing step, preferential evaporation of the organic solvent and some removal of the moisture in the film increases the concentration of non-volatile surfactant and silicon/oxygen compounds such as silica. As the surfactant concentration increases, the surfactant, the phosphorus based acid, and the silicon/oxygen compound form molecular assemblies within the thinning film. Continued drying solidifies and dopes the film with phosphorus, thereby entrenching the film microstructure which in the invention is a cubic phase structure of interconnecting pores of uniform diameter as shown in FIG. 13.

Preferably, the phosphorus doped mesoporous oxide film can be formed by removing the surfactant in a high temperature anneal of between about 350° C. and about 400° C. The annealing process may be performed at pressures ranging from near vacuum to atmospheric. As the surfactants are removed from the film, pores are formed as the silicon/oxygen component of the assemblies retain the shape of the oxide film, preferably a cubic phase structure, and harden to form a mesoporous film. The pores are usually have an interconnected structure, but many have terminal branches or may form amorphous layers. The selective formation of the mesoporous films result in a highly porous film of greater than about 50% with an exhibited dielectric constant of less than about 2.5, preferably between about 2.2 and about 1.6.

The annealing step is performed at a similar pressure to the pressure of the deposition module, i.e. greater than about 300 Torr. More preferably, the annealing process is performed at a pressure between about 300 Torr and about 760 Torr, most preferably between about 500 Torr and about 700 Torr. Preferably, the film is annealed in a non-reactive atmosphere, where the non-reactive gases are preferably nitrogen, an inert gas, such as argon and helium, or combinations thereof.

The oxide film is preferably annealed when the precursor compounds comprise methyl or phenyl groups, such as in phenyltriethoxy silane, p-bis(triethoxysilyl)benzene, bis(triethoxysilyl)methane, and methyltriethoxy silane. Annealing of the film deposited from the methyl or phenyl containing precursor compound in non-reactive environments prevents oxidation and removal the of methyl and phenyl compounds. With the retained methyl and phenyl groups, the film has a higher carbon content, which is believed to provide for a lower dielectric constant film with improved hydrophobicity. The annealing step likewise produces highly porous film of greater than about 50% with an exhibited dielectric constant of less than about 2.5, preferably between about 2.2 and about 1.6.

Alternatively, the deposited film may be exposed to an oxidizing atmosphere at an elevated temperature. The temperature of the oxidizing atmosphere is preferably in the range of about 200° C. to about 400° C. The oxidizing environment preferably comprises a oxygen, ozone, or an oxygen plasma to form a reactive oxygen species, wherein most preferably, a ozone plasma is formed in the chamber. The plasma is performed at a pressure of between about 0.5 Torr and about 10 Torr. The oxygen species bombard the film and react with the surfactant and any remaining moisture and solvent, thereby removing those agents from the film. The ion species are highly reactive and only require a short exposure of about 0.5 minutes to about 5 minutes for removal of the surfactant.

In a preferred optional procedure, a phosphoric-based acid sol-gel precursor is used in combination with a sol-gel precursor composed of an organic solvent. A pre-mixed primary chemical solution constituent can be comprised of tetraethylorthosilicate (TEOS), an alcohol such as ethyl alcohol, water, and a suitable organic acid, such as oxalic or glyoxylic acid, in a partially hydrolyzed state. Prior to application to the substrate, the primary chemical solution can be mixed with an alcohol, such as isopropanol, 1-propanol, or 2-butanol, an appropriate long chain surfactant, of which a portion may be esterfied by a phosphorus based acid, water, and a phosphorus based acid, in addition to a supplemental hydrolyzable silicon-bearing precursor, such as methyltriethoxysilane, p-bis (triethoxysilyl)benzene, bis(triethoxysilyl)methane, or phenyltriethoxysilane, in appropriate ratios such that the surfactant concentration exceeds the critical micelle concentration and self-assemblies, preferably into a cubic phase three-dimensional network. The phosphoric acid may be in addition to, or in place of the long chain surfactant phosphate, in the form of orthophosphoric acid, substituted orthophosphoric acid, alkoxysilylphosphonates, or alkoxysilylphosphonates chemical variants, and combinations thereof. The a phosphoric-based acid sol-gel precursor and the sol-gel precursor composed of an organic solvent are preferably mixed in a ratio of between about 1:1 and about 10:1.

Phosphorus doped mesoporous oxide films are hydrophilic and sensitive to moisture contamination, wherein moisture (dielectric constant (k)>78) contamination can have a detrimental effect on the film's overall dielectric constant. Therefore, the film is typically post treated by silylating the film and/or capping the film with a capping layer.

Silylation is the process of introducing silicon into the upper surface of a deposited film. In a chemical reaction, liquid phase or vapor phase diffusion of a reactive organosilane occurs in a reaction chamber, causing the hydrogen of hydroxyl groups present on the upper surface of the film to be replaced with an organo-silicon group, most commonly a trimethyl silyl group. An example of such a chemical reaction is the introduction of hexamethyldisilazane (HMDS) over a dielectric layer on the substrate to form a silyl ether. The silylation process is accomplished by diffusing a silylating agent at a temperature between about 25° C. to about 200° C., which affects the exposed phosphorus doped mesoporous oxide film to make the exposed film hydrophobic. The preferred silylating agents in this invention are tetramethyl disilazane (TMDS), hexamethyl disilazane (HMDS), and dimethylaminotrimethyl silane, or combinations thereof.

A capping layer deposited on the phosphorus doped mesoporous oxide layer may be any material which provides a barrier from diffusion of such materials as moisture, which serves as an etch stop, or which serves as a hard mask. Preferably, the capping layer is an low dielectric film deposited by a plasma enhanced chemical vapor deposition (PECVD) chamber at chamber pressures of about 0.5 Torr to about 10 Torr. Examples of suitable materials are silicon dioxide, silicon nitride, silicon oxynitride, and amorphous silicon carbide. An exemplary material to use as a liner layer is an amorphous silicon carbide layer, BLOk™, which is described in U.S. patent application Ser. No., 09/165,248, entitled, "A Silicon Carbide Deposition For Use As A Barrier Layer And An Etch Stop", Filed on Oct. 1, 1998, and incorporated herein.

Deposition of a Dual Damascene Structure

Figure 14:
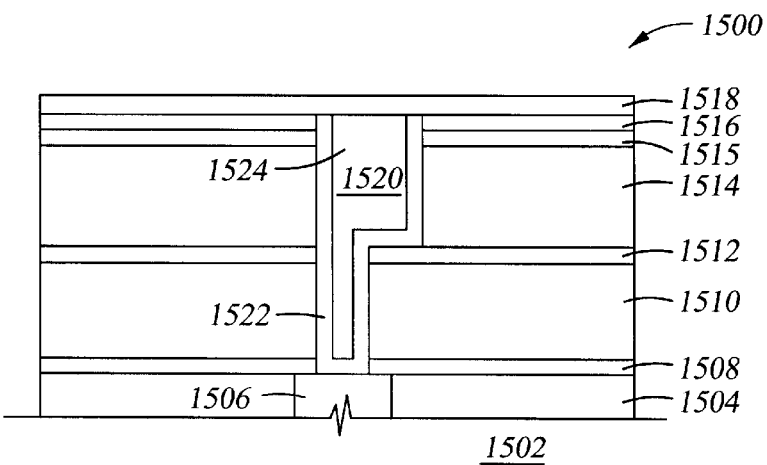
FIG. 14 is a cross sectional view showing a dual damascene structure comprising phosphorus doped mesoporous oxide layers of the present invention.

A preferred dual damascene structure 1500 fabricated in accordance with the invention is shown in FIG. 14, and the method of making the structure is sequentially depicted schematically in FIGS. 15A–15H, which are cross sectional views of a substrate having the steps of the invention formed thereon.

A dual damascene structure 1500 which includes a phosphorus doped mesoporous intermetal dielectric layer 1510 is shown in FIG. 14. The intermetal dielectric layers 1510 and 1514 deposited according to the invention have extremely low dielectric constants of less than 3, and are often referred to as extreme low k, or ELk, dielectric layers. A first dielectric layer 1510, preferably the phosphorus doped mesoporous silicon oxide layer of the present invention is deposited on a substrate 1502. The substrate comprising patterned conducting lines 1506 formed in a contact level substrate material 1504, with a first (or substrate) etch stop 1508 of silicon oxide, silicon nitride, silicon oxynitride, or amorphous hydrogenated silicon carbide (BLOk™), preferably silicon nitride, deposited thereon.

A silicon oxide, silicon nitride, silicon oxynitride, or hydrogenated silicon carbide (BLOk™) second etch stop 1512 is deposited on the first dielectric layer 1510, the second etch stop 1512 preferably comprises silicon oxynitride. A second dielectric layer 1514, preferably the phosphorus doped mesoporous silicon oxide layer of the present invention is deposited on the second etch stop 1512, with a passivating or barrier layer 1515, preferably comprising hydrogenated silicon carbide (BLOk™), deposited on the second dielectric layer 1514 and a third etch stop 1516 deposited on the passivating or barrier layer 1515. The deposited layers are etched to form a via 1520, which is subsequently filled with a conducting metal 1524, preferably copper, over a barrier layer 1522 conformally deposited within the via 1520. The structure is then planarized and a capping layer 1518 comprising silicon nitride, silicon oxide, silicon oxynitride, or hydrogenated silicon carbide, preferably comprising silicon nitride, is deposited thereon. The capping layer 1518 also serves as the substrate etch stop and corresponds to the first etch stop 1508 for subsequent dual damascene multilevel interconnects.

Figure 15A:
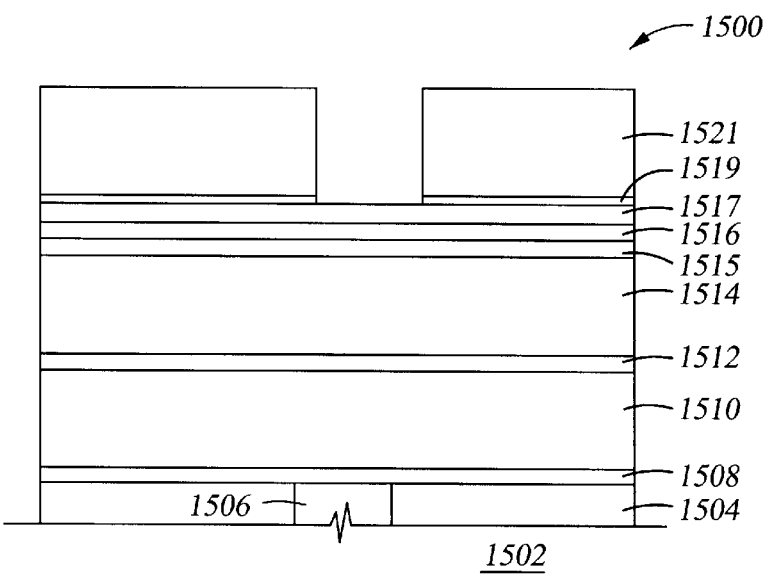
FIGS. 15A–H are cross sectional views showing a dual damascene deposition sequence utilizing phosphorus doped mesoporous oxide dielectric layers of the present inventions.

As shown in FIG. 15A, a first (or substrate) etch stop 1508 of silicon oxide, silicon nitride, silicon oxynitride, or amorphous hydrogenated silicon carbide, preferably silicon nitride is deposited to a thickness of about 1000 Å on the substrate 1502. The substrate 1502 comprises patterned conducting interconnects or lines 1506 formed in a contact level substrate material 1504. A first phosphorus doped mesoporous dielectric layer 1510 is deposited according to the invention on the first etch stop 1508. The first dielectric layer 1510 has a thickness of about 5,000 Å to about 10,000 Å, depending on the size of the structure to be fabricated, but has a preferable thickness of about 5,000 Å. The first dielectric layer 1510 may then be annealed at a temperature of between about 350° C. to about 450° C. to remove volatile contaminants from the layer 1510. A second etch stop 1512, such as silicon oxynitride, is deposited on the dielectric layer 1510 to a thickness of between about 200 Å and about 1000 Å, preferably at about 500 Å. A second phosphorus doped mesoporous dielectric layer 1514 is then deposited according to the invention on the first etch stop 1508 at a thickness of about 5,000 Å to about 10,000 Å, preferably about 5,000 Å. The second phosphorus doped mesoporous dielectric layer 1514 may then be annealed at a temperature of about 350° C. to about 450° C.

A passivating or barrier layer 1515, comprising hydrogenated silicon carbide (BLOk™), is then deposited on the second phosphorus doped mesoporous dielectric layer 1514. A third etch stop 1516 of silicon oxide, silicon nitride, silicon oxynitride, or amorphous hydrogenated silicon carbide (BLOk™), preferably silicon nitride is deposited on the passivating or barrier layer 1515 to a thickness of about 500 Å to about 1000 Å, preferably at about 1000 Å. A silicon oxide layer 1517 having a thickness of about 2000 Å is the deposited on the third etch stop 1516 to serve both as a hard etch mask as well as for future use in a chemical mechanical polishing (CMP) step. An anti-reflective coating (ARC) 1519 and a trench photomask comprising a photoresist layer 1521 are then respectfully deposited over the silicon oxide layer 1517. The photoresist layer 1521 is then patterned by conventional photolithography means known in the art.

Figure 15B:
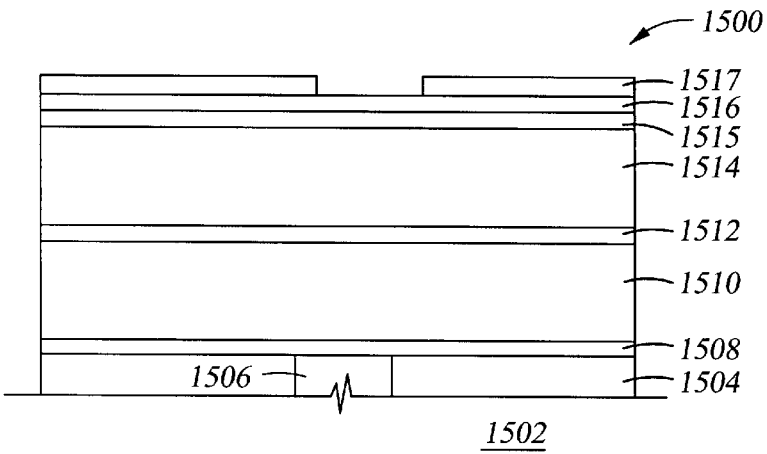
Figure 15C:
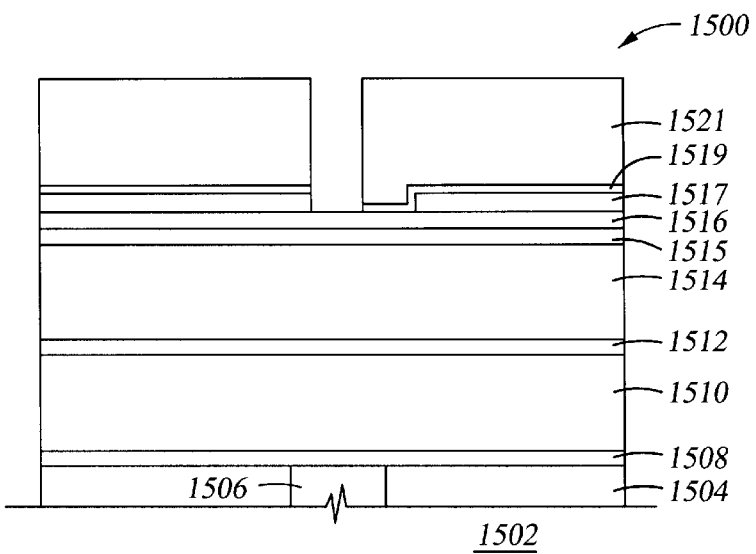

The silicon oxide layer 1517 is then etched by conventional means known in the art, preferably by an etch process using fluorocarbon chemistry, to expose the third etch 1516 as shown in FIG. 15B. The initial etch of the silicon oxide layer 1517 establishes the opening width, or trench width, of the dual damascene structure 1500. The opening width formed in the silicon oxide layer 1517 defines the horizontal interconnect of the dual damascene structure 1500 formed above the second etch stop 1514. The remaining photoresist 1521 is then ashed, or dry removed, for preparation of the via etch. For formation of the contact or via width of the dual damascene structure, another anti-reflective coating 1519 and photoresist layer 1521 are then respectfully deposited over the thin silicon oxide layer 1517, and further patterned by photolithography to expose the third etch layer 1516 by the via width of the structure as shown in FIG. 15C.

Figure 15D:
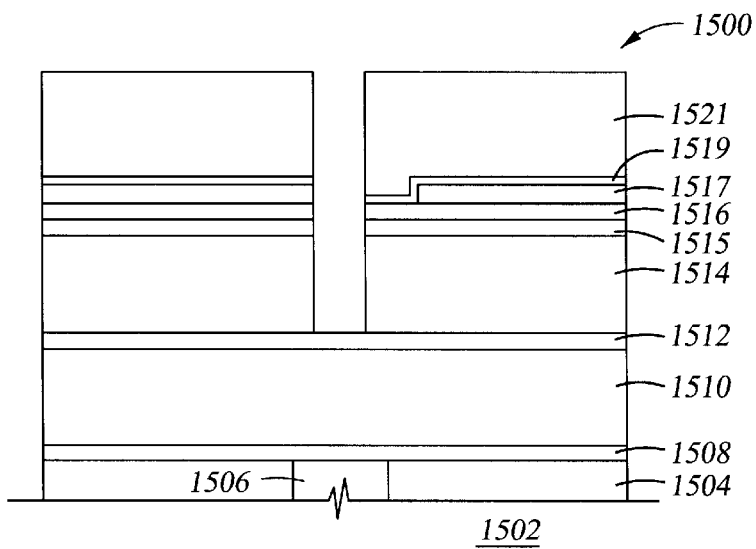
Figure 15E:
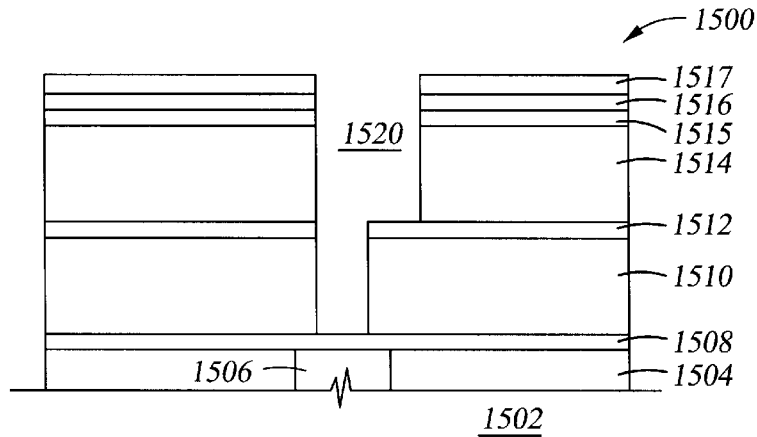
Figure 15F:
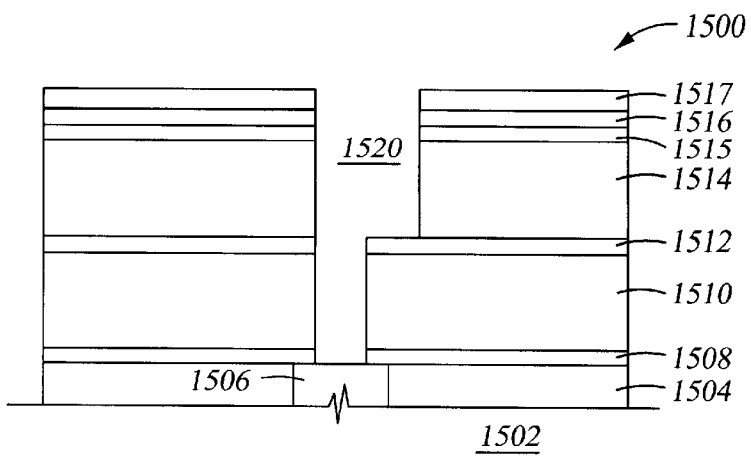

Referring to FIG. 15D, the third etch stop 1516, the passivating or barrier layer 1515, and second dielectric layer 1514, are trenched etched to expose the second etch stop 1512. The via 1520 is then formed by via etching the second dielectric layer 1514 to the second etch stop 1512 using anisotropic etching techniques to define the metallization structure (i.e., the interconnect and contact/via) at the width established by the silicon oxide layer 1517; and etching the first dielectric layer 1510 to the first etch stop 1508 at the via width established during the etching of the third etch stop 1516, second dielectric layer 1514, and the second etch stop 1512 as shown in FIG. 15E. Any photoresist or ARC material used to pattern the second etch stop 1512 or the second dielectric layer 1514 is removed using an oxygen strip or other suitable process. FIG. 15F shows the etching of the first etch stop 1508 protecting the substrate 1502, exposing the underlying patterned metal lines 1506 in the contact level substrate material 1504. The patterned metal lines 1506 preferably comprise a conducting metal such as copper. The dual damascene structure 1500 is then pre-cleaned by conventional means known in the art prior to subsequent layer deposition.

Figure 15G:
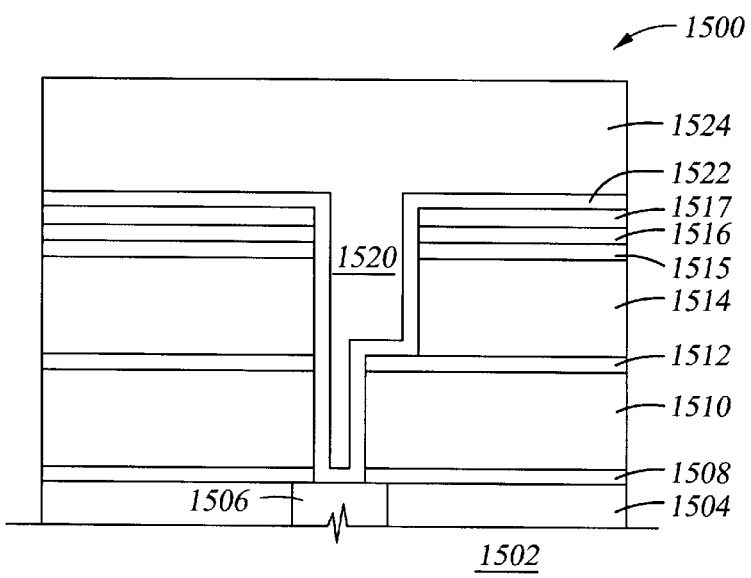
Figure 15H:
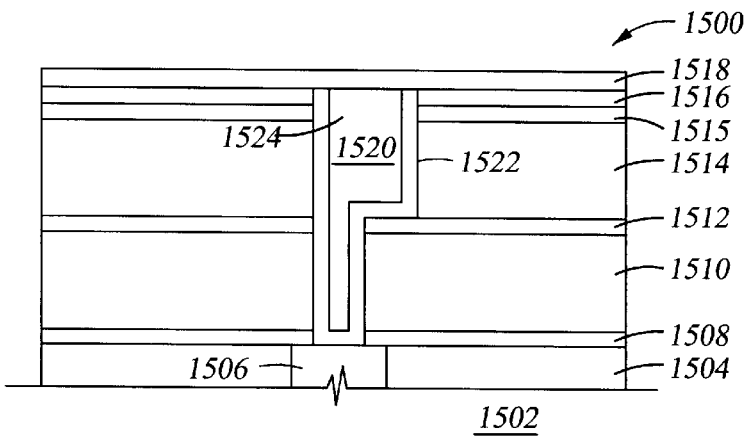

The metallization structure is then formed with a conductive material such as aluminum, copper, tungsten combinations thereof. Presently, the trend is to use copper to form the smaller features due to the low resistivity of copper (1.7 mW-cm compared to 3.1 mW-cm for aluminum). Preferably, as shown in FIG. 15G, a suitable barrier layer 1522 such as tantalum nitride is first deposited conformally in the metallization pattern 1520 to prevent copper migration into the surrounding silicon and/or dielectric material. Thereafter, a layer of copper 1524 is deposited using either chemical vapor deposition, physical vapor deposition, electroplating, preferably by electroplating, to form the conductive structure. Once the structure has been filled with copper or other metal, the surface is planarized using chemical mechanical polishing and capped with a capping layer 1518, preferably comprising silicon nitride and having a thickness of about 1000 Å, as shown in FIG. 15H. Prior to planarizing the surface, the metal may be annealed in a hydrogen atmosphere to recrystallize the copper fill and to remove voids that may have formed in the structure 1500. While not shown, a copper seed layer may be deposited prior to the copper layer 1524 when the copper layer 1524 is deposited by an electroplating process. The dual damascene formation process may then be repeated to deposit further interconnection levels, of which modern microprocessor integrated circuits have 5 or 6 interconnection levels.

While foregoing is directed to the preferred embodiment of the present invention, other and further embodiments of the invention may be devised without departing from the basic scope thereof, and the scope thereof is determined by the claims that follow.

What is claimed is:

1. A process for forming a mesoporous oxide film on a substrate, comprising:

forming a sol-gel precursor comprising a silicon/oxygen compound, a phosphorus containing acid solution, an organic solvent, water, and a surfactant;

depositing the sol-gel precursor on the substrate;

curing the deposited sol-gel precursor to form an oxide film; and exposing the oxide film to a surfactant removing process to form a mesoporous oxide film having a phosphorus oxide concentration between about 2% and about 8% by weight.

2. The process of claim 1, wherein the silicon/oxygen compound is selected from the group consisting of tetraethylorthosilicate, methyltriethoxysilane, phenyltriethoxysilane, hexaethoxydisiloxane, p-bis (triethoxysilyl)benzene, bis(triethoxysilyl)methane, and combinations thereof.

3. The process of claim 2, wherein the silicon/oxygen compound further comprises one or more phosphonic acid ligands, (—PO(OH)$_2$).

4. The process of claim 3, wherein the silicon/oxygen compound is selected from the group of o-phosphotriethoxysilane $(CH_3CH_2O)_3SiOPO(OH)_2$, o-phosphoethylenetriethoxysilane $(CH_3CH_2O)_3SiCH_2CH_2OPO(OH)_2$, phosphorylethylenetriethoxysilane $(CH_3CH_2O)_3SiCH_2CH_2PO(OH)_2$, p-phosphorylphenylenetriethoxysilane $(CH_3CH_2O)_3Si(C_6H_4)PO(OH)_2$, phosphonotriethoxysilyl ketone $(CH_3CH_2O)_3SiC(O)PO(OH)_2$, phosphonotriethoxysilane $CH_3CH_2O)_3SiPO(OH)_2$, and combinations thereof.

5. The process of claim 1, wherein the organic solvent is selected from the group consisting of ethanol, isopropanol, n-propanol, n-butanol, sec-butanol, t-butanol, ethylene glycol, and combinations thereof.

6. The process of claim 1, wherein the phosphorus containing acid solution is a phosphorus based acid selected from the group consisting of orthophosphoric acid ($H_3PO_4$), ammonium dihydrogen phosphate, tetramethylammonium dihydrogen phosphate, phosphate esters of long-chain alcohols, alkoxysilylphosphonates, substituted derivatives thereof, and combinations thereof.

7. The process of claim 1, wherein the phosphorus containing acid solution further comprises a volatile inorganic acid selected from the group consisting of nitric acid, hydrochloric acid, perchloric acid, and combinations thereof.

8. The process of claim 1, wherein the phosphorus containing acid solution further comprises an organic acid selected from the group consisting of oxalic acid, glyoxylic acid, and combinations thereof.

9. The process of claim 1, wherein the surfactant is selected from the group consisting of p-$(CH_3)_3C$—$CH_2$—$C_6H_4$—$CH_2$—$(OCH_2CH_2)_8OH$, p-$(CH_3)_3COC_6H_4CH_2(OCH_2CH_2)_8$—OH, polyethylene oxide co-polymer derivatives, polyethylene oxide-polypropylene oxide-polyethylene oxide triblock copolymer derivatives, and combinations thereof.

10. The process of claim 1, wherein the surfactant further comprises a phosphorus component.

11. The process of claim 10, wherein the phosphorus based component is a phosphate of a alcohol-terminated surfactant selected from the group comprising p-$(CH_3)_3CCH_2C_6H_4CH_2(OCH_2CH_2)_N$—OH, p-$(CH_3)_3COC_6H_4CH_2(OCH_2CH_2)_N$—OH, $CH_3(CH_2)_K$—OH, $CH_3(CH_2)_I(CH_2CH_2O)_J$—OH, $HO(CH_2CH_2O)_M(CH_2C(CH3)HO)_L(CH_2CH_2O)_MH$, p-$(CH_3)_3CCH_2C(CH_3)_2C_6H_4(OCH_2CH_2)_N$—OH, and fluorinated derivatives thereof, and combinations thereof, wherein N is an integer from 6 to 12, K is an integer from 13 to 17, I is an integer from 6 to 15, J is an integer from 20 to 106, and L is an integer from 20 to 80.

12. The process of claim 1, wherein the phosphorus containing acid comprises, an phosphoric based acid selected from the group consisting of orthophosphoric acid ($H_3PO_4$), ammonium dihydrogen phosphate, tetramethylammonium dihydrogen phosphate, phosphate esters of long-chain alcohols, alkoxysilylphosphonates, substituted derivatives thereof, and combinations thereof; and a volatile acid selected from the group consisting of nitric acid, hydrochloric acid, perchloric acid, and combinations thereof.

13. The process of claim 1, wherein the phosphorus containing acid solution has a pH of about 2.

14. The process of claim 1, wherein the phosphorus containing acid solution has a pH of about 6 to about 7 following the curing the deposited sol-gel precursor.

15. The process of claim 1, wherein the surfactant removing process comprises exposing the film to an oxidizing environment at a temperature between about 200° C. to about 400° C.

16. The process of claim 1, wherein the surfactant removing process comprises heating the film at a temperature of about 200° C. to about 450° C. in an inert atmosphere.

17. A process for forming a mesoporous oxide film on a substrate, comprising:

a. forming a first sol-gel precursor comprising a first silicon/oxygen compound, a organic acid, a first organic solvent, water, and a first surfactant;

b. forming a second sol-gel precursor comprising a second silicon/oxygen compound, a phosphorus based acid, a second organic solvent, water, and a second surfactant c. mixing the first and second sol-gel precursors to form a mixed sol-gel precursor, wherein the first and second sol-gel precursors are mixed in a first to second ratio of between about 1:1 and about 10:1;
d. depositing the mixed sol-gel precursor on the substrate;
e. curing the deposited mixed sol-gel precursor to form an oxide film; and
f. exposing the oxide film to a surfactant removing process to form a mesoporous oxide film.

18. The process of claim 17, wherein the first and second silicon/oxygen compound are selected from the group consisting of tetraethylorthosilicate, methyltdethoxysilane, phenyltriethoxysilane, hexaethoxydisiloxane, p-bis(triethoxysilyl)benzene, bis(triethoxysilyl)methane, and combinations thereof.

19. The process of claim 18, wherein the first and second silicon/oxygen compound further comprise one or more phosphonic acid ligands, ($-PO(OH)_2$).

20. The process of claim 19, wherein the first and second silicon/oxygen compound is selected from the group of o-phosphotriethoxysilane $(CH_3CH_2O)_3SiOPO(OH)_2$, o-phosphoethylenetriethoxysilane $(CH_3CH_2O)_3SiCH_2CH_2OPO(OH)_2$, phosphorylethylenetriethoxysilane $(CH_3CH_2O)_3SiCH_2CH_2PO(OH)_2$, p-phosphorylphenylenetriethoxysilane $(CH_3CH_2O)_3Si(C_6H_4)PO(OH)_2$, phosphonotriethoxysilyl ketone $(CH_3CH_2O)_3SiC(O)PO(OH)_2$, phosphonotriethoxysilane $(CH_3CH_2O)_3SiPO(OH)_2$, and combinations thereof.

21. The process of claim 17, wherein the first and second organic solvents are selected from the group consisting of ethanol, isopropanol, n-propanol, n-butanol, sec-butanol, t-butanol, ethylene glycol, and combinations thereof.

22. The process of claim 17, wherein the phosphorus containing acid solution is a phosphorus based acid selected from the group consisting of orthophosphoric acid ($H_3PO_4$), ammonium dihydrogen phosphate, tetramethylammonium dihydrogen phosphate, phosphate esters of long-chain alcohols, alkoxysilylphosphonates, substituted derivatives thereof, and combinations thereof.

23. The process of claim 17, wherein the phosphorus containing acid solution further comprises a volatile inorganic acid selected from the group consisting of nitric acid, hydrochloric acid, perchloric acid, and combinations thereof.

24. The process of claim 17, wherein the phosphorus containing acid solution further comprises an organic acid selected from the group consisting of oxalic acid, glyoxylic acid, and combinations thereof.

25. The process of claim 17, wherein the first and second surfactants are selected from the group consisting of p-$(CH_3)_3C-CH_2-C_6H_4-CH_2-(OCH_2CH_2)_8OH$, p-$(CH_3)_3COC_6H_4CH_2(OCH_2CH_2)_8-OH$, and other polyethylene oxide co-polymer derivatives, polyethylene oxide-polypropylene oxide-polyethylene oxide triblock copolymer derivatives, and combinations thereof.

26. The process of claim 17, wherein the first and second surfactants further comprise a phophorus component.

27. The process of claim 26, wherein the phosphorus based component is a phosphate of a alcohol-terminated surfactant selected from the group comprising p-$(CH_3)_3CCH_2C_6H_4CH_2(OCH_2CH_2)_N-OH$, p-$(CH_3)_3COC_6H_4CH_2(OCH_2CH_2)_N-OH$, $CH_3(CH_2)_K-OH$, $CH_3(CH_2)_I(CH_2CH_2O)_J-OH$, $HO(CH_2CH_2O)_M(CH_2C(CH3)HO)_L(CH_2CH_2O)_MH$, p-$(CH_3)_3CCH_2C(CH_3)_2C_6H_4(OCH_2CH_2)_N-OH$, and fluorinated derivatives thereof, and combinations thereof, wherein N is an integer from 6 to 12, K is an integer from 13 to 17, I is an integer from 6 to 15, J is an integer from 20 to 106, and L is an integer from 20 to 80.

28. The process of claim 17, wherein the phosphorus containing acid comprises:
a phosphoric based acid selected from the group consisting of orthophosphoric acid ($H_3PO_4$), ammonium dihydrogen phosphate, tetramethylammonium dihydrogen phosphate, phosphate esters of long-chain alcohols, alkoxysilylphosphonates, substituted derivatives thereof, and combinations thereof; and
a volatile acid selected from the group consisting of nitric acid, hydrochloric acid, perchloric acid, and combinations thereof.

29. The process of claim 17, wherein the phosphorus containing acid solution has a pH of about 2.

30. The process of claim 17, wherein the phosphorus containing acid solution has a pH of about 6 to about 7 following the curing the deposited sol-gel precursor.

31. The process of claim 17, wherein the mesoporous oxide film has a phosphorus oxide concentration of between about 2% and about 8% by weight.

32. The process of claim 17, wherein the surfactant removing process comprises exposing the film to an oxidizing environment at a temperature between about 200° C. to about 400° C.

33. The process of claim 17, wherein the surfactant removing process comprises heating the film at a temperature of about 200° C. to about 450° C. in an inert atmosphere.

34. A method of forming a dual damascene structure, comprising:
depositing a first etch stop on a substrate;
depositing a first phosphorus doped mesoporous oxide film having a phosphorus oxide concentration between about 2% and about 8% by weight on the first etch stop by:
  forming a sol-gel precursor comprising a silicon/oxygen compound, a phosphorus containing acid solution, an organic solvent, water, and a surfactant;
  depositing the sol-gel precursor on the substrate;
  curing the deposited sol-gel precursor to form an oxide film; and
  exposing the oxide film to a surfactant removing process to form the first phosphorus doped mesoporous oxide film;
depositing a second etch stop on the first phosphorus doped mesoporous oxide film;
depositing a second phosphorus doped mesoporous oxide film on the second etch stop by:
  forming a sol-gel precursor comprising a silicon/oxygen compound, a phosphorus containing acid solution, an organic solvent, water, and a surfactant;
  depositing the sol-gel precursor on the substrate;
  curing the deposited sol-gel precursor to form an oxide film; and
  exposing the oxide film to a surfactant removing process to form the second phosphorus doped mesoporous oxide film;
depositing a third etch stop on the second phosphorus doped mesoporous oxide film;
etching the third etch stop and second phosphorus doped mesoporous oxide film to define a vertical interconnect opening; and
etching the second etch stop, the first phosphorus doped mesoporous oxide film, and the first etch stop through the vertical interconnect opening to further define the vertical interconnect, thereby exposing the substrate, and etching the third etch stop and the second phosphorus doped mesoporous oxide film to define a horizontal interconnect and form a dual damascene feature.

35. The method of claim 34, further comprising depositing a conformal barrier layer film in the defined interconnect.

36. The method of claim 35, further comprising depositing a copper layer on the conformal barrier layer.

37. The method of claim 26, further comprising depositing a capping layer on the copper layer.

38. The method of claim 26, wherein the first and second phosphorus doped mesoporous oxide films have a phosphorus oxide concentration of between about 2% and about 8% by weight.

39. The method of claim 36, wherein the horizontal interconnect opening is defined by depositing a patterned oxide layer on the third etch stop prior to etching the third etch stop and the second phosphorus doped mesoporous oxide films.

40. The method of claim 36, wherein the vertical interconnect opening is defined by depositing a patterned photoresist film on the patterned oxide layer prior to etching the third etch stop and second phosphorus doped mesoporous oxide films.

* * * * *

UNITED STATES PATENT AND TRADEMARK OFFICE
CERTIFICATE OF CORRECTION

PATENT NO.    : 6,559,070 B1
DATED         : May 6, 2003
INVENTOR(S)   : Mandal

It is certified that error appears in the above-identified patent and that said Letters Patent is hereby corrected as shown below:

Column 6,
Lines 21-22, please change "thereofPhos-phorus" to -- thereof. Phos-phorus --.

Column 16,
Line 46, please change "to an to an" to -- to an --.

Column 20,
Line 15, please change "6in" to -- 620 --.

Column 25,
Line 16, please delete "WY".

Column 32,
Lines 66-67, please change "1.7 mW-cm" to -- 1.7 $\mu\Omega$-cm --.
Line 67, please change "3.1mW-cm" to -- 3.1 $\mu\Omega$-cm --.

Signed and Sealed this

Seventh Day of October, 2003

JAMES E. ROGAN
*Director of the United States Patent and Trademark Office*